United States Patent
Ariie et al.

(10) Patent No.: US 7,548,118 B2
(45) Date of Patent: Jun. 16, 2009

(54) SEMICONDUCTOR DEVICE AND POWER AMPLIFIER

(75) Inventors: Mitsuo Ariie, Kusatsu (JP); Yasutaka Sugimoto, Omihachiman (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 11/753,319

(22) Filed: May 24, 2007

(65) Prior Publication Data

US 2007/0222033 A1  Sep. 27, 2007

Related U.S. Application Data

(63) Continuation of application No. PCT/JP2005/003873, filed on Mar. 7, 2005, and a continuation of application No. PCT/JP2005/017827, filed on Sep. 28, 2005.

(30) Foreign Application Priority Data

| Nov. 29, 2004 | (JP) | ............................... 2004-344376 |
| Jun. 23, 2005 | (JP) | ............................... 2005-183738 |

(51) Int. Cl.
*H03F 3/68* (2006.01)
(52) U.S. Cl. .................................................... 330/295
(58) Field of Classification Search ............. 330/124 R, 330/295, 296, 285
See application file for complete search history.

(56) References Cited

U.S. PATENT DOCUMENTS

| 5,608,353 | A | * | 3/1997 | Pratt ........................... 330/295 |
| 6,232,840 | B1 | * | 5/2001 | Teeter et al. ................. 330/295 |
| 6,448,859 | B2 | * | 9/2002 | Morizuka .................... 330/295 |
| 6,686,801 | B1 | * | 2/2004 | Cho et al. .................... 330/295 |
| 6,828,861 | B2 | | 12/2004 | Cho et al. |

FOREIGN PATENT DOCUMENTS

| DE | 103 33 553 A1 | 3/2004 |
| DE | 600 29 227 T2 | 6/2007 |
| JP | 10-083998 | 3/1998 |
| JP | 10-209769 | 8/1998 |
| JP | 2003-324325 | 11/2003 |

OTHER PUBLICATIONS

Written Opinion.
International Search Report issued Dec. 27, 2005.
German Office Action issued in connection with corresponding German Application No. 112005002800.3-35.
Chinese Office Action issued Nov. 7, 2008 in connection with corresponding Chinese Application No. 200580037810.3 with Japanese and English language translations.

* cited by examiner

*Primary Examiner*—Khanh V Nguyen
(74) *Attorney, Agent, or Firm*—Ostrolenk, Faber, Gerb & Soffen, LLP

(57) ABSTRACT

A semiconductor device 1 includes a plurality of amplifier circuits 2 connected in parallel between an input terminal RFin and an output terminal RFout. Each of the amplifier circuits 2 includes an HBT 3, an oscillation stabilizing circuit 4 connected between the input terminal RFin and a base B of the HBT 3, and a ballast resistor 5 connected between a bias terminal Bin and the base B of the HBT 3. The oscillation stabilizing circuit 4 includes a resistor 6 and a capacitor 7 connected in parallel. Thus, thermorunaway of the HBT 3 can be prevented using the ballast resistor 5, and the stability against oscillation can be improved using the oscillation stabilizing circuit 4 even at low frequencies.

16 Claims, 19 Drawing Sheets

SEMICONDUCTOR DEVICE AND POWER AMPLIFIER

CROSS-REFERENCE TO RELATED APPLICATIONS

This is a continuation under 35 U.S.C. § 111(a) of PCT/JP2005/003873 filed Mar. 7, 2005 and PCT/JP2005/017827 filed Sep. 28, 2005, and claims priority of JP2004-344376 filed Nov. 29, 2004 and JP2005-183738 filed Jun. 23, 2005, incorporated by reference.

BACKGROUND OF THE INVENTION

1. Technical Field

The present invention relates to a semiconductor device that is suitable for use in, for example, high frequency circuits in wireless communication apparatuses and a power amplifier that is constructed with the semiconductor device.

2. Background Art

In general, conventional semiconductor devices are known, in which a plurality of amplifier circuits that amplify high frequency signals are connected in parallel between an input terminal and an output terminal (for example, refer to Patent Documents 1 to 4). In such conventional art, each of the amplifier circuits is constructed with, for example, a bipolar transistor. In such case, the bipolar transistor may have a structure in which the collector is connected to the output terminal, the emitter is connected to a ground terminal, and high frequency signals input to the base are amplified. Moreover, in the conventional art, a ballast resistor may be connected to the base so as to suppress thermorunaway of the bipolar transistor.

Circuit structures are disclosed in Patent Documents 1 and 2, in which high frequency signals and a bias voltage are separately input to the base of a bipolar transistor, and a ballast resistor is connected to a path on the bias voltage side. In this case, since a ballast resistor is connected in parallel with a path for high frequency signals, the gain of the high frequency signals is not reduced.

On the other hand, a structure is disclosed in Patent Document 3, in which high frequency signals and a bias voltage are supplied together via a ballast resistor, and a capacitor is connected in parallel with the ballast resistor. Thus, in the conventional art in Patent Document 3, a decrease in the gain of high frequency signals in a frequency band in use is alleviated.

Moreover, a structure is disclosed in Patent Document 4, in which high frequency signals and a bias voltage are separately input to the base of a bipolar transistor, a ballast resistor is connected to a path on the bias voltage side, and additionally, a by-pass capacitor is connected between an input terminal and a bias terminal (a terminal for a bias voltage). In this case, distortion of high frequency signals is reduced by causing a part of the alternating current component of the base current to bypass the ballast resistor using the by-pass capacitor.

Patent Document 1: U.S. Pat. No. 5,629,648
Patent Document 2: Japanese Unexamined Patent Application Publication No. 2001-196865
Patent Document 3: U.S. Pat. No. 5,321,279
Patent Document 4: Japanese Unexamined Patent Application Publication No. 2003-324325

In these conventional examples, although thermal stability of a bipolar transistor can be achieved by use of a ballast resistor, stability against oscillation is not considered. On the other hand, a semiconductor element such as a bipolar transistor does not self-stabilize and is unstable in a wide range of frequencies. Moreover, the lower the frequency, the higher the gain of a semiconductor element. Thus, abnormal oscillation tends to occur at low frequencies.

In the semiconductor device described in Patent Document 1, a ballast resistor is connected in parallel with a path for high frequency signals. Thus, the ballast resistor does not contribute to stability against oscillation, and the bipolar transistor is unstable in a wide range of low frequencies.

In the semiconductor device described in Patent Document 2, a first resistor is connected in a path for high frequency signals, and a second resistor is connected in series with the first resistor in a path for a bias voltage. In this case, the first and second resistors function as ballast resistors, and abnormal oscillation of a bipolar transistor is suppressed by the first resistor, so that the stability can be improved. However, in Patent Document 2, although the stability in frequencies in use (high frequencies) is considered, a band of frequencies lower than the frequencies in use is not considered. The resistance of the first resistor is, for example, about one tenth of the resistance of the second resistor. Thus, for example, when the frequency, in use, of high frequency signals is 5 GHz, a bipolar transistor is unstable at low frequencies of 1 GHz or less.

On the other hand, when the resistance of the first resistor is increased, a voltage drop due to the base current increases, which limits the obtainable amount of increase in the current. For example, when a semiconductor device is used as a power amplifier, a necessary output power is obtained by increasing the current in response to an increase in the input power. A problem exists in that, when the resistance of the first resistor is excessively increased, an increase in the output power is suppressed by suppression of an increase in the current. Similarly, such suppression of an increase in the output power also occurs when a capacitor is connected in parallel with the first resistor.

The semiconductor device described in Patent Document 3 has a structure in which a capacitor is connected in parallel with a ballast resistor, and high frequency signals and a bias voltage are supplied together. However, since a ballast resistor is provided to achieve the thermal stability, stability against oscillation at low frequencies cannot be achieved sufficiently when the resistance of the ballast resistor is set to a level necessary to achieve thermal stability. On the other hand, when the resistance of the ballast resistor is increased, a problem exists, as in the case in Patent Document 2, in that a voltage drop due to the base current excessively increases, so that an increase in the output power is suppressed.

The semiconductor device described in Patent Document 4 has a structure in which a capacitor is connected between an input terminal and a bias terminal to reduce distortion of high frequency signals. However, since the impedance of the capacitor depends on the frequency, a problem exists in that the distortion cannot be reduced in a wide band. Moreover, in the semiconductor device described in Patent Document 4, a ballast resistor is connected in parallel with a path for high frequency signals, as in the case in Patent Document 1. Thus, a problem exists in that a bipolar transistor is unstable in a wide band of low frequencies.

SUMMARY OF THE INVENTION

In view of the aforementioned problems in the conventional art, the present invention provides a semiconductor device and a power amplifier in which thermorunaway of a bipolar transistor can be prevented and stability against oscillation can be improved even at low frequencies.

(1) To solve the aforementioned problems, according to some features of the present invention, a semiconductor device may include a plurality of amplifier circuits that amplify high frequency signals and are connected in parallel between an input terminal and an output terminal. Each of the amplifier circuits includes a bipolar transistor, a collector of the bipolar transistor being connected to the output terminal, an oscillation stabilizing circuit connected between the input terminal and a base of the bipolar transistor, the oscillation stabilizing circuit having a resistive component for low frequency signals and short-circuited for high frequency signals, and a ballast circuit that prevents thermorunaway of the bipolar transistor, one end of the ballast circuit being connected to a bias terminal, the other end being connected between the oscillation stabilizing circuit and the base of the bipolar transistor.

According to these features of the present invention, since the oscillation stabilizing circuit is provided between the input terminal and the base of the bipolar transistor, the oscillation stabilizing circuit has a resistive component for low frequency signals input from the input terminal and is short-circuited for high frequency signals. Thus, since the oscillation stabilizing circuit functions as a resistor for signals having frequencies lower than the frequencies in use, oscillation of low frequency signals can be suppressed, so that the stability can be improved. On the other hand, since the oscillation stabilizing circuit is short-circuited for signals having frequencies higher than the frequencies in use, high frequency signals can be input to the base of the bipolar transistor without loss and amplified.

Moreover, the ballast circuit is provided between the bias terminal for the bipolar transistor and the base of the bipolar transistor. Thus, even when an overcurrent is caused to flow into the base by heating of the bipolar transistor or the like, a voltage drop corresponding to the overcurrent can be produced using the ballast circuit, so that thermorunaway of the bipolar transistor can be suppressed.

Moreover, an arrangement is adopted, in which the oscillation stabilizing circuit and the ballast circuit are provided in parallel, so that the oscillation stabilizing circuit and the ballast circuit are independently connected to the base of the bipolar transistor. Thus, the oscillation stabilizing circuit and the ballast circuit do not affect each other, so that the oscillation stabilizing circuit and the ballast circuit can be designed separately. Thus, even when both the suppression of thermorunaway and the stability against oscillation are achieved, an excessive voltage drop by the ballast circuit as in the conventional art does not occur, so that the minimum voltage drop necessary to prevent thermorunaway can be produced. As a result, unnecessary voltage drop can be prevented, so that a high output power can be obtained.

(2) According to another feature of the present invention, the oscillation stabilizing circuit may include an RC parallel circuit in which a resistor and a capacitor are connected in parallel.

Since such an arrangement is adopted, the capacitor in the RC parallel circuit is interrupted for low frequency signals, and the capacitor in the RC parallel circuit is short-circuited for high frequency signals. Thus, low frequency signals pass through the resistor, and high frequency signals pass through the capacitor. Accordingly, the RC parallel circuit has a resistive component for low frequency signals and is short-circuited for high frequency signals. As a result, the RC parallel circuit has a resistive component for signals having frequencies lower than the frequencies in use, so that oscillation of low frequency signals can be suppressed, thereby improving the stability. On the other hand, the RC parallel circuit is short-circuited for signals having frequencies higher than the frequencies in use, so that high frequency signals can be input to the base of the bipolar transistor without loss. Moreover, in the RC parallel circuit, low frequency signals pass through the resistor, and high frequency signals pass through the capacitor. Thus, for example, the stability against oscillation can be adjusted in response to the resistance of the resistor, and frequencies of signals for which the capacitor is short-circuited can be adjusted in response to the capacitance of the capacitor.

(3) According to another feature of the present invention, the ballast circuit advantageously may include a ballast resistor connected between the bias terminal and the base of the bipolar transistor.

Thus, even when an overcurrent is caused to flow into the base by heating of the bipolar transistor or the like, a voltage drop corresponding to the overcurrent can be produced using the ballast resistor, so that thermorunaway of the bipolar transistor can be suppressed.

(4) According to another feature of the present invention, the bipolar transistor may include a heterojunction bipolar transistor (HBT).

Thus, high frequency signals can be amplified while high-speed processing, low power consumption, and other features of the HBT are achieved. Thus, the semiconductor device can be applied to, for example, wireless communication apparatuses.

(5) According to another feature of the present invention, a distortion reducing resistor that reduces distortion of high frequency signals on a side of the output terminal may be connected between the input terminal and the bias terminal.

In this case, the distortion reducing resistor allows a part of the alternating current component of the base current to bypass the ballast resistor and flow between the base of the bipolar transistor and the bias terminal. Thus, the collector current can be increased as the power of an input signal increases, and distortion of high frequency signals can be reduced. Moreover, the impedance of the distortion reducing resistor does not substantially depend on the frequency, and thus the distortion reducing resistor can cause a part of the alternating current component of the base current to bypass across a wide band, so that distortion of high frequency signals can be reduced across a wide band.

(6) According to another feature of the present invention, the plurality of amplifier circuits connected in parallel may advantageously be monolithically formed on a semiconductor substrate.

Thus, each of the amplifier circuits can be constructed with the bipolar transistor, the capacitor, and the resistor formed on the semiconductor substrate, so that a monolithic microwave integrated circuit (MMIC) that amplifies high frequency signals can be formed.

(7) A power amplifier may be constructed with the semiconductor device according to the foregoing features of the present invention.

Thus, stability against oscillation is achieved at all frequencies, thermorunaway can be prevented, and a high output power can be obtained.

Other features and advantages of the present invention will become apparent from the following description of embodiments of invention which refers to the accompanying drawings.

DETAILED DESCRIPTION OF EMBODIMENTS OF THE INVENTION

Figure 1:
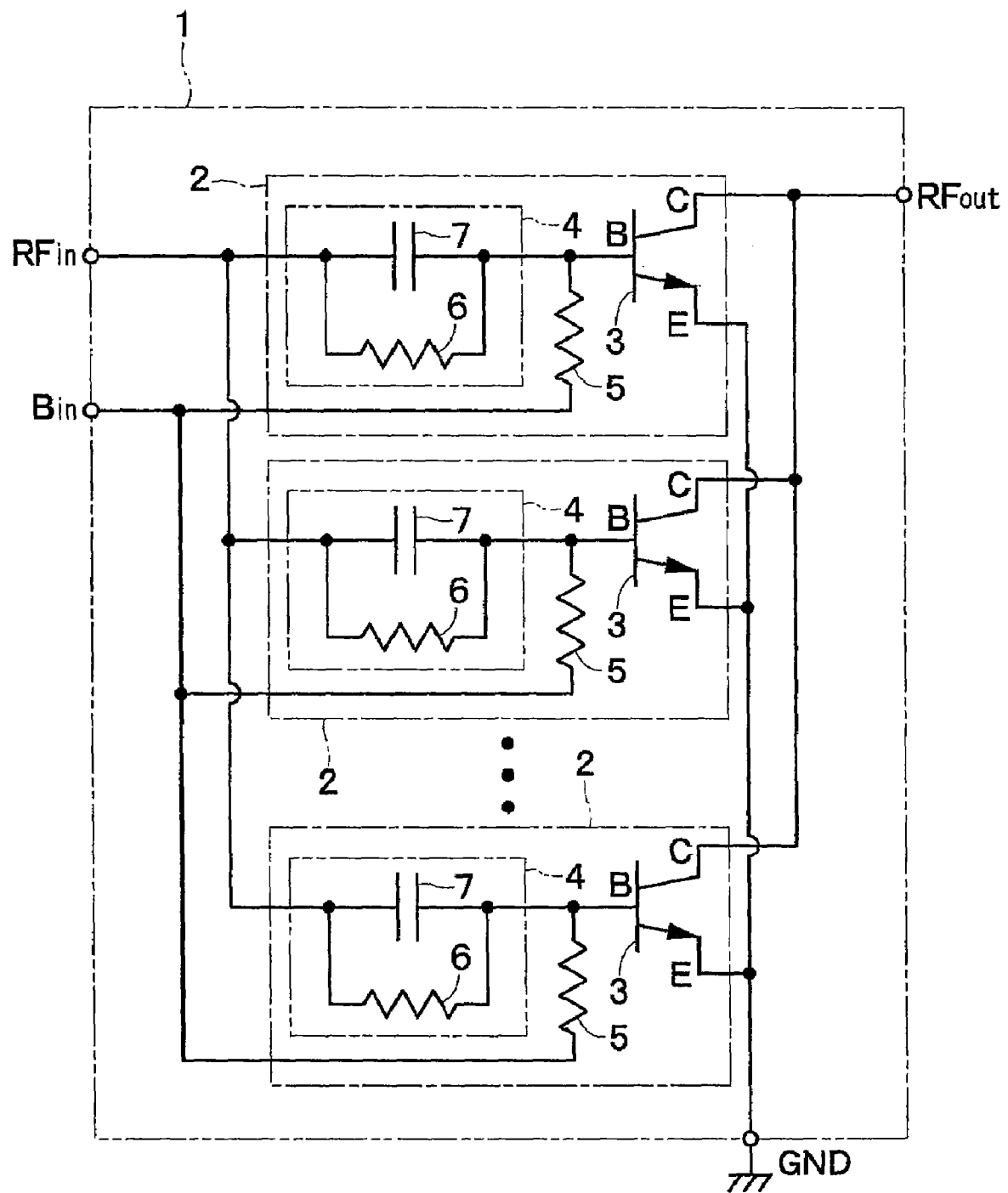
FIG. 1 is a circuit diagram showing a semiconductor device according to a first embodiment of the invention.
Figure 2:
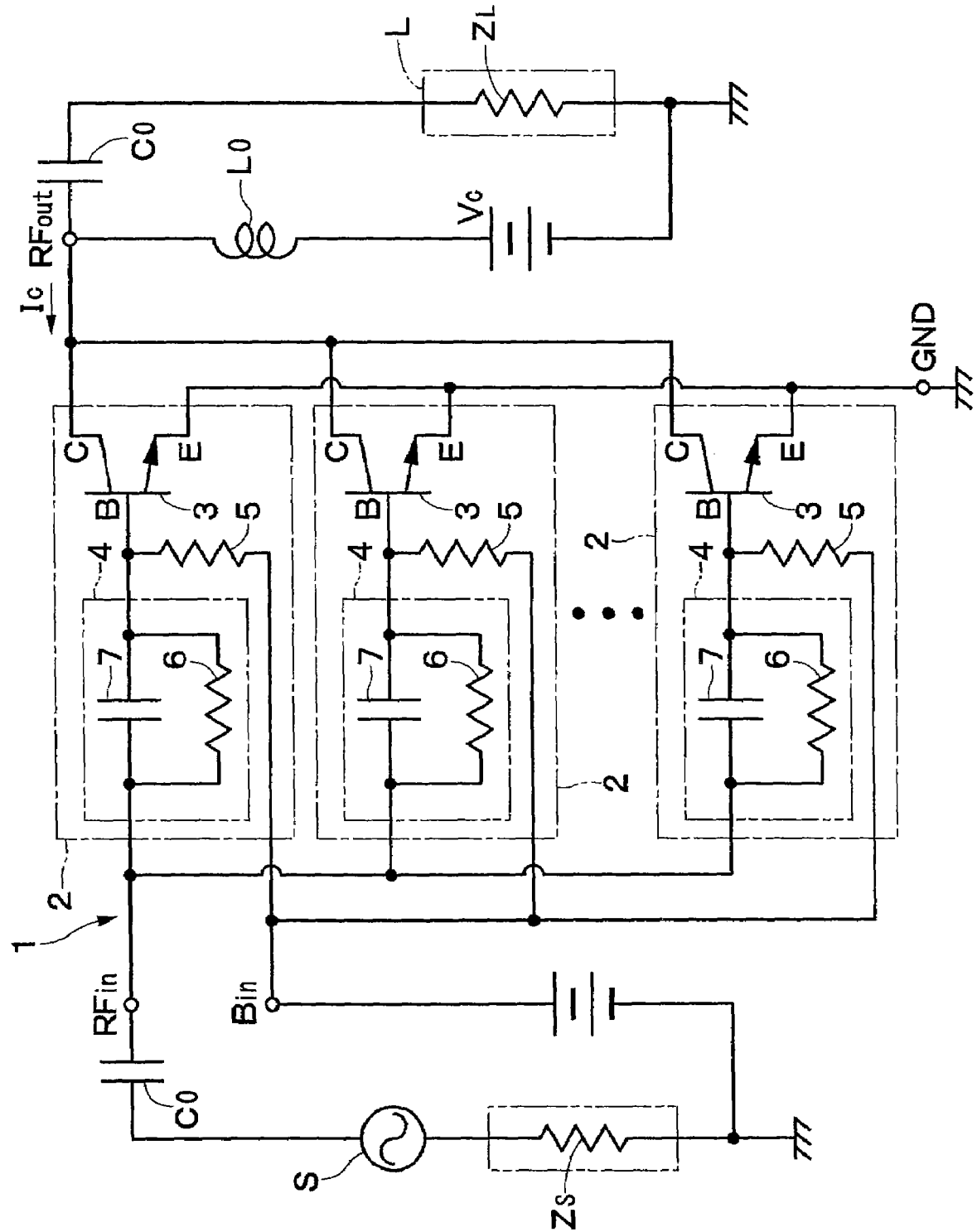
FIG. 2 is a circuit diagram showing a state in which the semiconductor device shown in FIG. 1 is connected to a signal source and a load.

Reference Numerals 1 semiconductor device
2 amplifier circuit
3 heterojunction bipolar transistor (HBT)
4 oscillation stabilizing circuit
5 ballast resistor
6 resistor
7 capacitor
21 distortion reducing resistor
41 semiconductor substrate
RFin input terminal
RFout output terminal
Bin bias terminal
GND ground terminal Semiconductor devices according to several embodiments of the present invention will now be described in detail with reference to the attached drawings.

FIG. 1 shows a semiconductor device according to a first embodiment. In the drawing, a semiconductor device 1 includes a plurality of amplifier circuits 2 (unit cells), described below, connected in parallel between an input terminal RFin and an output terminal RFout.

The amplifier circuits 2 that amplify a high frequency signal RF each include a heterojunction bipolar transistor 3 (hereinafter called an HBT 3), an oscillation stabilizing circuit 4 connected between the input terminal RFin and a base B of the HBT 3, and a ballast resistor 5 functioning as a ballast circuit, one end of which being connected to a bias terminal Bin, the other end being connected to a point between the oscillation stabilizing circuit 4 and the base B of the HBT 3.

In the plurality of the amplifier circuits 2, collectors C of the HBTs 3 are connected to each other, and emitters E are connected to each other. The collectors C are connected to the output terminal RFout, and the emitters E are connected to a ground terminal GND. Moreover, in the plurality of the amplifier circuits 2, all input sides of the oscillation stabilizing circuits 4 are connected to the input terminal RFin, and all input sides of the ballast resistors 5 are connected to the bias terminal Bin. In this arrangement, the plurality of the amplifier circuits 2 are connected in parallel between the input terminal RFin and the output terminal RFout.

Moreover, the ballast resistor 5 is connected between the bias terminal Bin and the base B of the HBT 3 for applying a bias voltage. Thus, even when an overcurrent is caused to flow from the bias terminal Bin to the base B by heating of the HBT 3, a voltage drop corresponding to the overcurrent can be produced using the ballast resistor 5, so that thermorunaway of the HBT 3 can be suppressed. In this case, the resistance of the ballast resistor 5 is set to a value such that the minimum voltage drop necessary to suppress thermorunaway is produced.

Moreover, the oscillation stabilizing circuit 4 includes an RC parallel circuit that forms a high pass filter in which a resistor 6 and a capacitor 7 are connected in parallel. The capacitor 7 is interrupted (is substantially an open circuit) for low frequency signals and is substantially short-circuited for high frequency signals. Thus, low frequency signals pass through the resistor 6, and high frequency signals pass through the capacitor 7. Accordingly, the oscillation stabilizing circuit 4 has a resistive component for low frequency signals and is short-circuited for high frequency signals. The capacitance of the capacitor 7 is set to a value such that the frequencies in use correspond to a pass band of desired high frequency signals. On the other hand, the resistance of the resistor 6 is set to a value such that oscillation of the HBT 3 can be prevented in a cut-off band of the oscillation stabilizing circuit 4.

The semiconductor device 1 according to this embodiment has the aforementioned structure. The operation of the semiconductor device 1 will now be described.

The ground terminal GND is first connected to ground, and a predetermined bias voltage is applied to the bias terminal Bin. Thus, the bias voltage is applied to the bases B of the HBTs 3 via the ballast resistors 5, so that the HBTs 3 are activated. In this state, high frequency signals having frequencies of, for example, several gigahertz to several tens of gigahertz in use are input to the input terminal RFin. Thus, the plurality of the parallel HBTs 3 connected to the input terminal RFin amplify the high frequency signals in response to power supplied to the bases B and output the high frequency signals from the output terminal RFout. As a result, the output terminal RFout sums and outputs the high frequency signals amplified by the plurality of the amplifier circuits 2. Thus, high-power high frequency signals can be obtained depending on the number of the amplifier circuits 2.

When an overcurrent is caused to flow into the base B by heating of the HBT 3, a voltage drop corresponding to the overcurrent is produced by the ballast resistor 5 connected between the bias terminal Bin and the base B of the HBT 3. As a result, the voltage of the base B decreases. Thus, the current of the HBT 3 can be decreased, thereby preventing thermorunaway of the HBT 3.

The stability against oscillation of the semiconductor device 1 will now be considered with reference to FIGS. 2 to 14.

Figure 6:
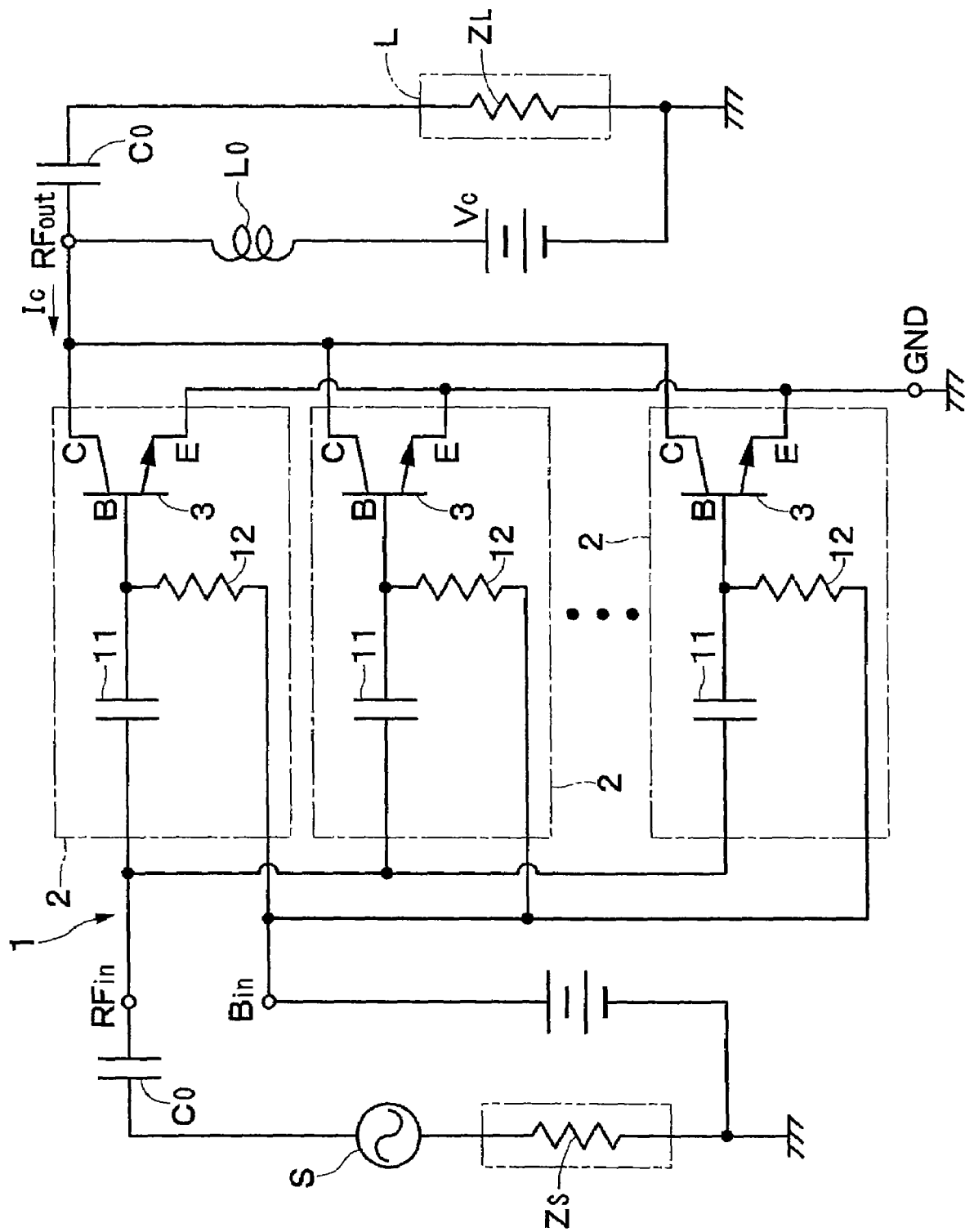
FIG. 6 is a circuit diagram showing a state in which a semiconductor device of a first comparative example is connected to a signal source and a load.
Figure 7:
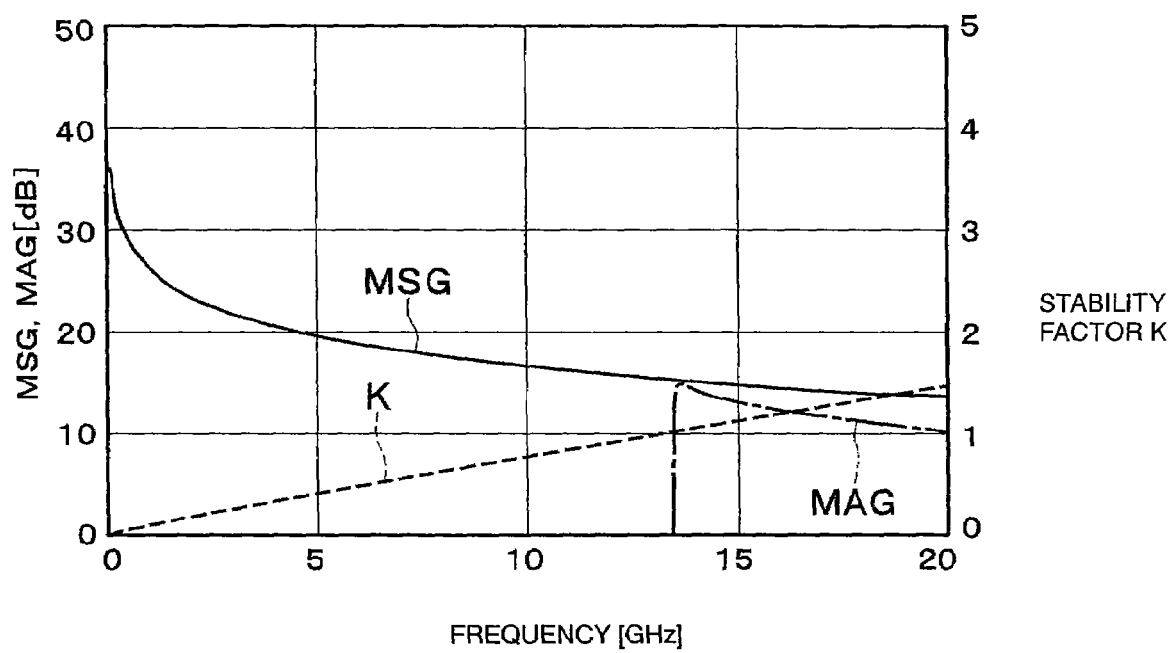
FIG. 7 is a characteristic diagram showing frequency characteristics of the stability factor, the maximum stable power gain, and the maximum available power gain of the semiconductor device shown in FIG. 6.

In a first comparative example shown in FIG. 6, a coupling capacitor 11 is connected between the base B of the HBT 3 in each of the amplifier circuits 2 and the input terminal RFin, and a ballast resistor 12 is connected between the base B and the bias terminal Bin. In this case, regarding the semiconductor device 1 of the first comparative example, frequency characteristics of a stability factor K that is an index indicating stability against oscillation of a circuit and frequency characteristics of the maximum stable power gain MSG and the maximum available power gain MAG were examined by simulation. FIG. 7 shows the results.

In this simulation, the semiconductor device 1 includes ten pieces of the amplifier circuit 2, the capacitance of the capacitor 11 is set to a value, for example, 0.5 pF, such that desired high frequency signals can pass though, and the resistance of the ballast resistor 12 is set to a value, for example, 300 Ω, such that thermorunaway can be prevented. Moreover, a collector voltage Vc that is a drive voltage is 3 V, and a collector current Ic is 50.24 mA. Moreover, a signal source impedance Zs and a load impedance ZL are provided on a signal source S side (an input side) and a load L side (an output side), respectively. A capacitor C0 that blocks a direct current is connected to the signal source S side, and the capacitor C0 and an RF choke inductor L0 are connected to the load L side.

As is shown by the results in FIG. 7, in the first comparative example, the stability factor K is less than one (K<1) in a wide band of low frequencies of, for example, direct current to 13 GHz, and the HBT 3 is unstable. The reason for this is that, since the ballast resistor 12 is connected in parallel with a path for high frequency signals, the ballast resistor 12 does not contribute to the stability against oscillation. On the other hand, the lower the frequency, the higher the maximum stable power gain MSG. Thus, in the first comparative example, even when a weak low frequency signal is input, the HBT 3 is apt to oscillate. Accordingly, the HBT 3 is highly unstable. As a result, a problem exists in that the maximum available power gain MAG is obtained only for high frequency signals of 13 GHz or more.

Figure 8:
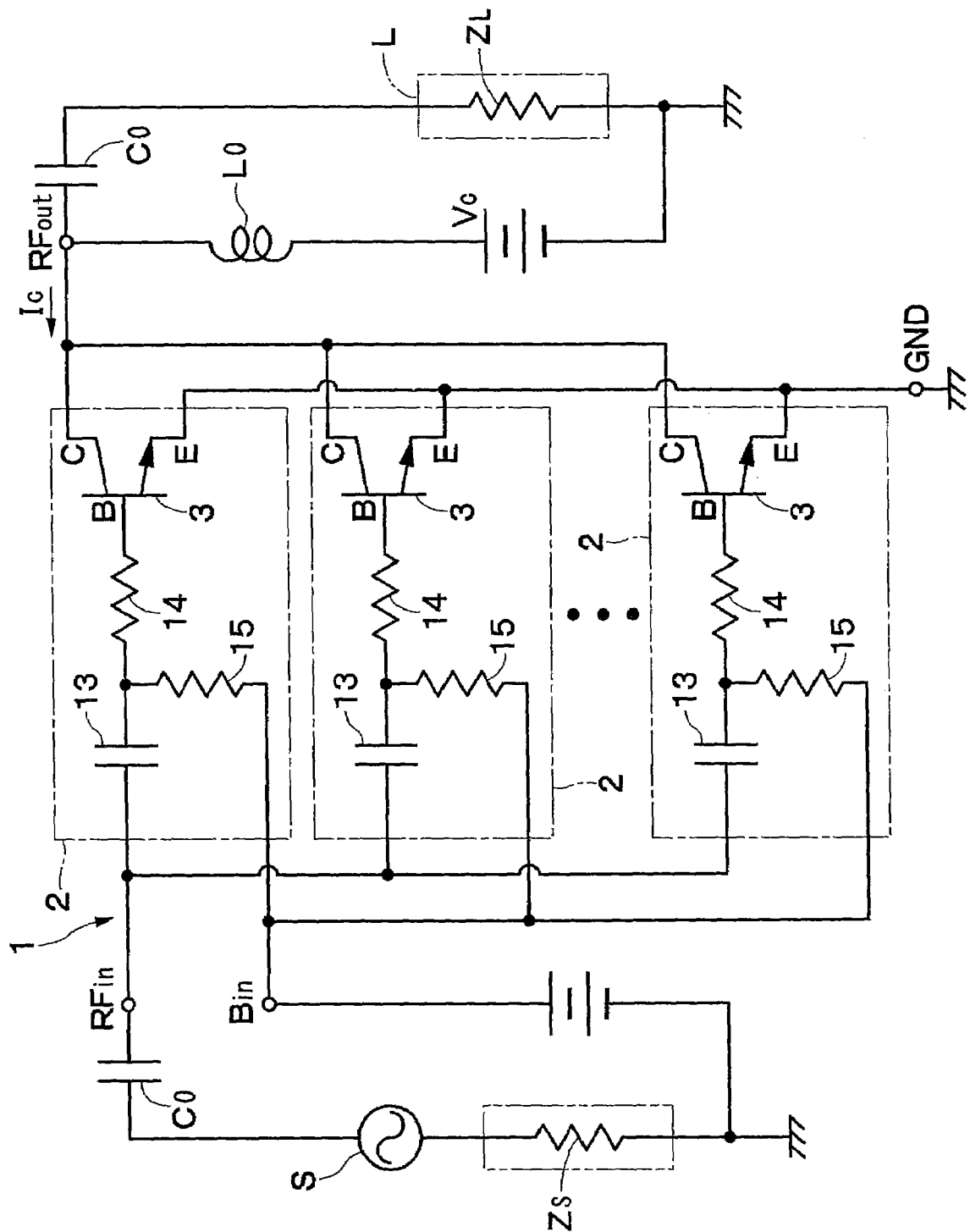
FIG. 8 is a circuit diagram showing a state in which a semiconductor device of a second comparative example is connected to a signal source and a load.
Figure 9:
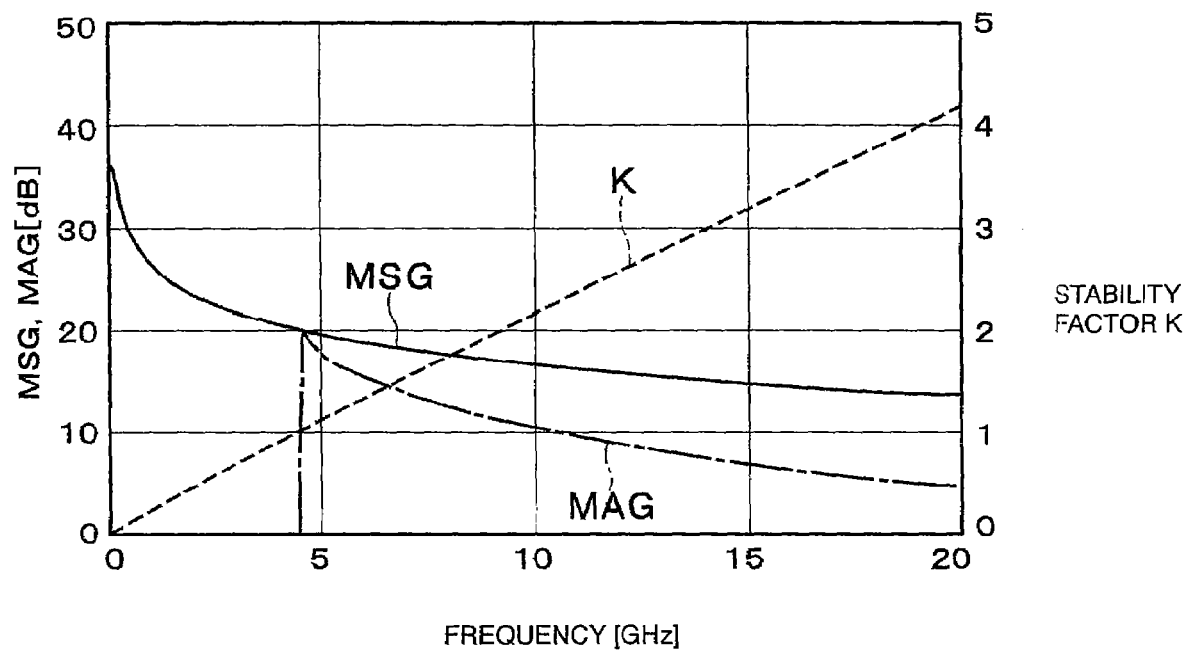
FIG. 9 is a characteristic diagram showing frequency characteristics of the stability factor, the maximum stable power gain, and the maximum available power gain of the semiconductor device shown in FIG. 8.

Then, in a second comparative example shown in FIG. 8, a capacitor 13 and a first resistor 14 are connected in series on a path for high frequency signals, and a second resistor 15 is connected in series with the first resistor 14 on a path for a bias voltage. In this case, regarding the semiconductor device 1 of the second comparative example, frequency characteristics of the stability factor K, the maximum stable power gain MSG, and the maximum available power gain MAG were examined by simulation. FIG. 9 shows the results.

In this simulation, the semiconductor device 1 includes ten pieces of the amplifier circuit 2, as in the first comparative example. The capacitance of the capacitor 13 is, for example, 0.5 pF, the resistance of the first resistor 14 is, for example, 300 Ω, and the resistance of the second resistor 15 is, for example, 10 Ω. Moreover, a drive voltage (the collector voltage Vc) is 3 V, and the collector current Ic is 50.06 mA. Moreover, the signal source impedance Zs, the load impedance ZL, the capacitor C0, and the inductor L0 are connected to the signal source S side (the input side) and the load L side (the output side), as in the first comparative example.

As is shown by the results in FIG. 9, in the second comparative example, since abnormal oscillation of a bipolar transistor is suppressed by the first resistor 14, the stability is improved from that in the first comparative example. However, the stability factor K is still less than one (K<1) in a band of low frequencies of direct current to about 4 GHz, and the HBT 3 is unstable. Thus, the maximum available power gain MAG is obtained only for high frequency signals of 4 GHz or more.

On the other hand, when the resistance of the first resistor 14 is increased, a voltage drop by the base current increases, so that an increase in the current is suppressed. In this case, since the first resistor 14 is provided on the path for high frequency signals, an increase in the current by high frequency signals is also suppressed. Thus, a problem exists in that an increase in the output power is also suppressed.

Figure 10:
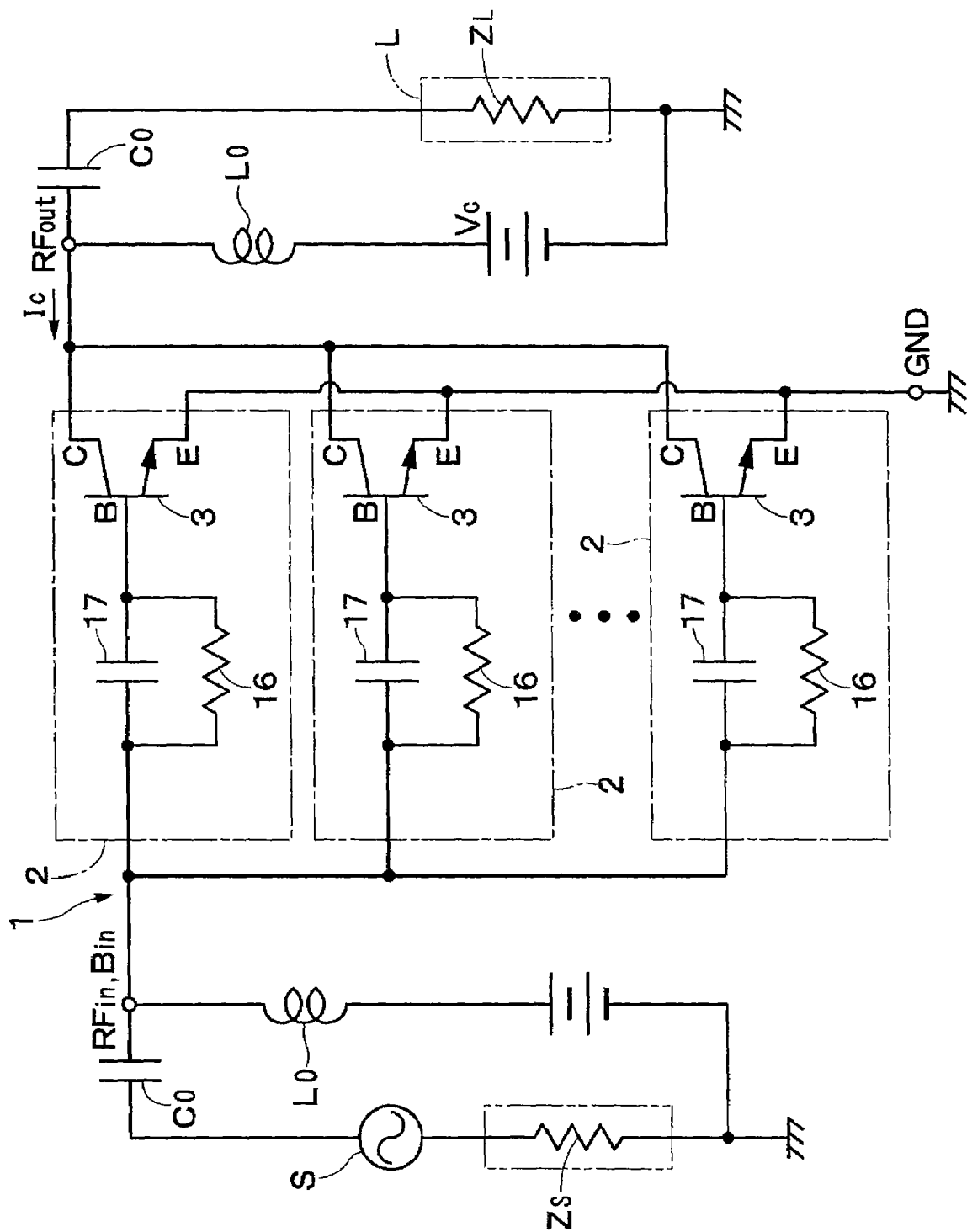
FIG. 10 is a circuit diagram showing a state in which a semiconductor device of a third comparative example is connected to a signal source and a load.
Figure 11:
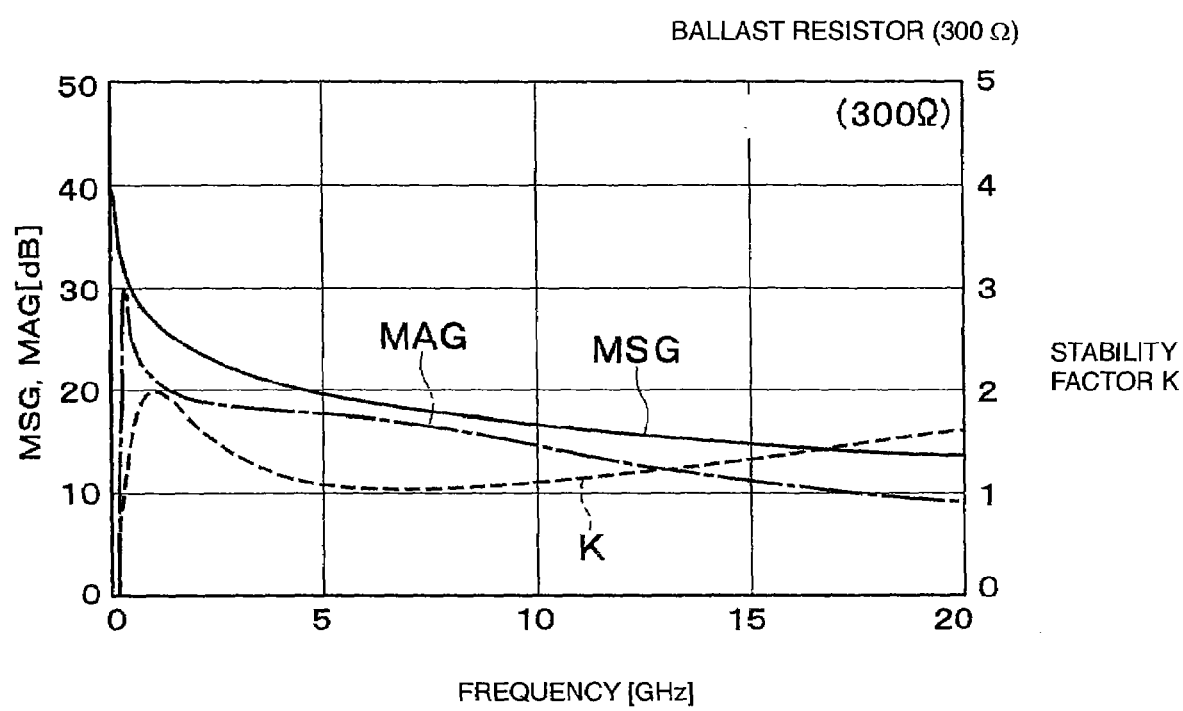
FIG. 11 is a characteristic diagram showing frequency characteristics of the stability factor, the maximum stable power gain, and the maximum available power gain in a case where a ballast resistor is set to 300 Ω in the semiconductor device shown in FIG. 10.

Then, in a third comparative example shown in FIG. 10, a ballast resistor 16 is connected in parallel with a capacitor 17, and high frequency signals and a bias voltage are supplied through the same path. In this case, regarding the semiconductor device 1 of the third comparative example, frequency characteristics of the stability factor K, the maximum stable power gain MSC; and the maximum available power gain MAG were examined by simulation. FIG. 11 shows the results.

In this simulation, the semiconductor device 1 includes ten pieces of the amplifier circuit 2, as in the first comparative example. The resistance of the ballast resistor 16 is, for example, 300 Ω, and the capacitance of the capacitor 17 is, for example, 0.55 pF. Moreover, a drive voltage (the collector voltage Vc) is 3 V, and the collector current Ic is 50.24 mA. Moreover, the signal source impedance Zs, the load impedance ZL, the capacitor C0, and the inductor L0 are connected to the signal source S side (the input side) and the load L side (the output side), as in the first comparative example.

As is shown by the results in FIG. 11, in the third comparative example, since the ballast resistor 16 connected in parallel with the capacitor 17 is provided on the path for high frequency signals, abnormal oscillation of the HBT 3 at low frequencies can be suppressed by the ballast resistor 16. Thus, the stability is improved from that in the first comparative example. However, even in the third comparative example, since the ballast resistor 16 is set to a value (for example, 300 Ω) such that thermorunaway can be prevented, the stability at low frequencies is not sufficiently achieved. Thus, the stability factor K is less than one (K<1) at frequencies of less than several hundreds of megahertz, and the HBT 3 is unstable. Thus, the maximum available power gain MAG is obtained only for high frequency signals of several hundreds of megahertz or more.

Figure 12:
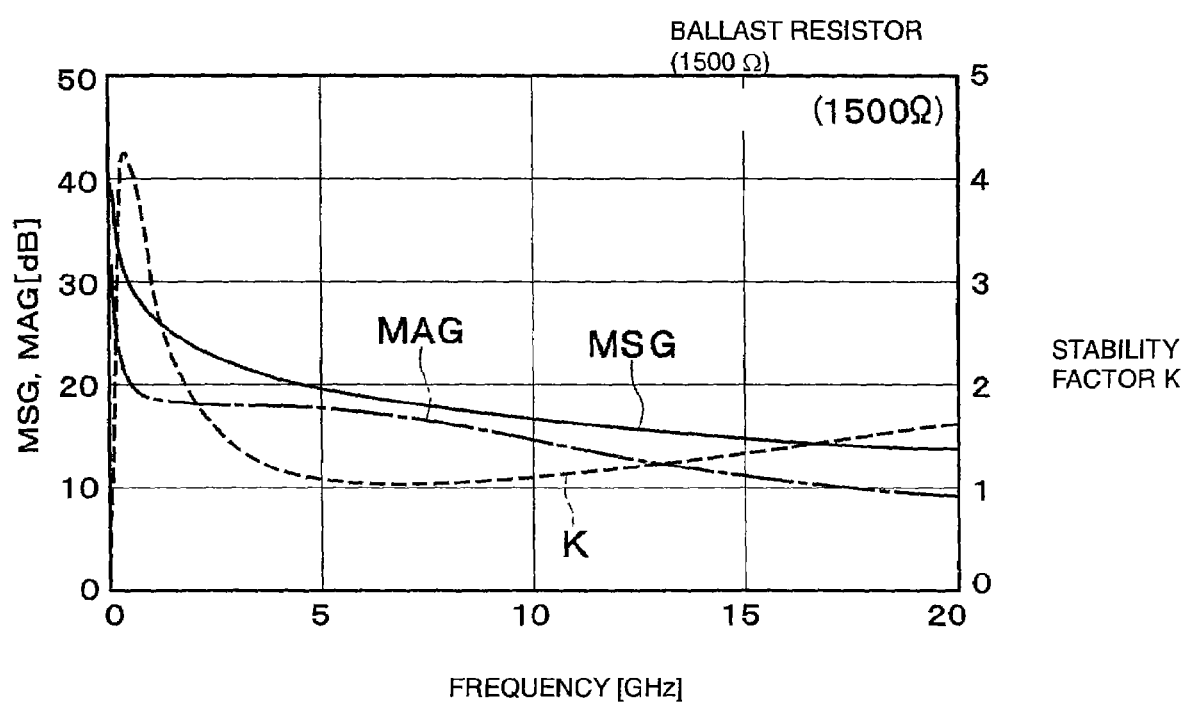
FIG. 12 is a characteristic diagram showing frequency characteristics of the stability factor, the maximum stable power gain, and the maximum available power gain in a case where the ballast resistor is set to 1500 Ω in the semiconductor device shown in FIG. 10.

In a case where the resistance of the ballast resistor 16 is set to, for example, 1500 Ω in the semiconductor device 1 of the third comparative example, frequency characteristics of the stability factor K, the maximum stable power gain MSG, and the maximum available power gain MAG were examined by simulation. FIG. 12 shows the results. In this simulation, the capacitance of the capacitor 17 is, for example, 0.25 pF, a drive voltage (the collector voltage Vc) is 3 V, and the collector current Ic is 50.61 mA. The other conditions are the same as those in the case where the resistance of the ballast resistor 16 is, for example, 300 Ω.

As is shown by the results in FIG. 12, in the case where the resistance of the ballast resistor 16 is set to, for example, 1500 Ω, the stability factor K exceeds one (K>1) even at frequencies of several hundreds of megahertz or less, so that the stability against oscillation is improved across the substantially entire frequency band.

Figure 13:
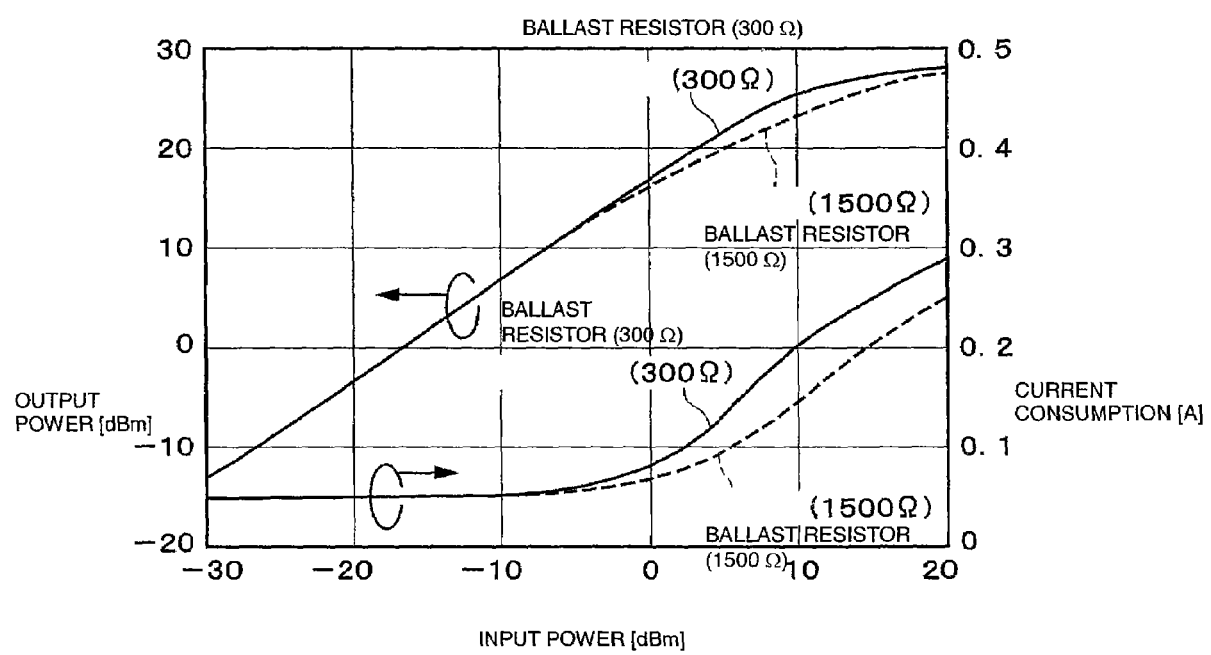
FIG. 13 is a characteristic diagram showing the output power and the current consumption in relation to the input power in a case where the ballast resistor is set to 300 Ω and 1500 Ω in the semiconductor device shown in FIG. 10.
Figure 14:
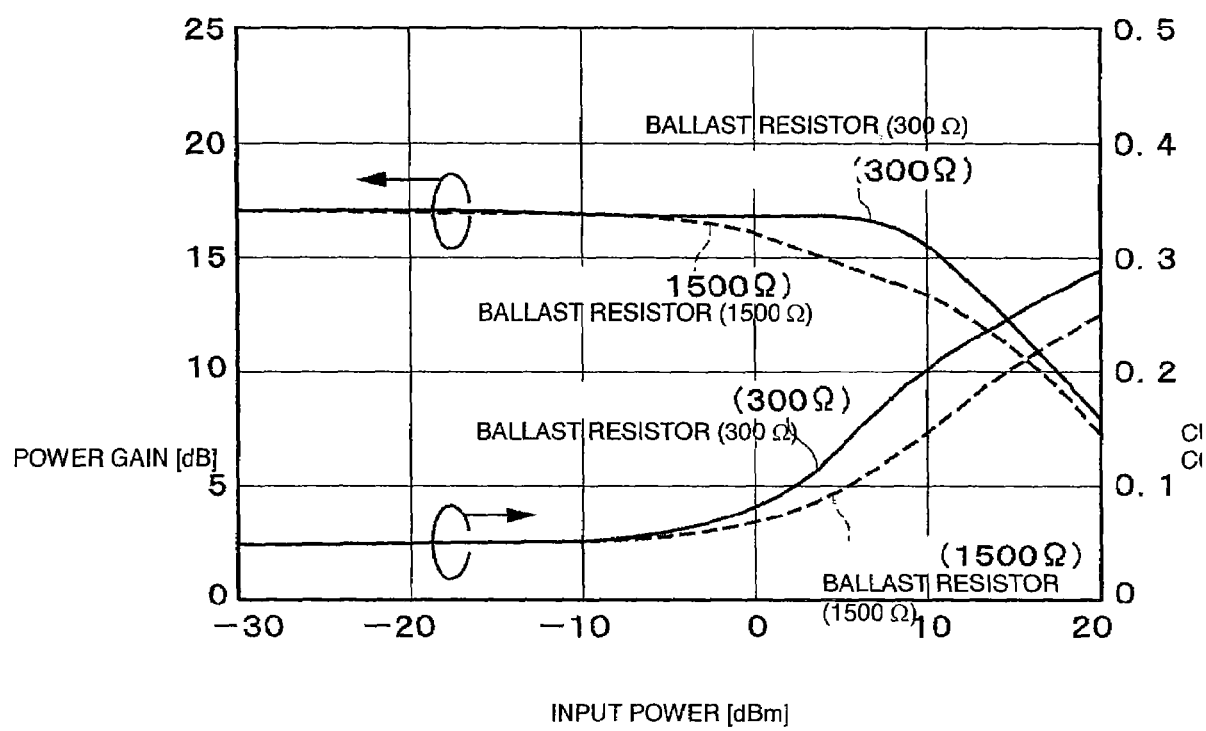
FIG. 14 is a characteristic diagram showing the power gain and the current consumption in relation to the input power in a case where the ballast resistor is set to 300 Ω and 1500 Ω in the semiconductor device shown in FIG. 10.

However, when the semiconductor device 1 is used a power amplifier, in addition to achieving the stability against oscillation, the output power and the power gain need to be increased in relation to the input power. Thus, in a case where the resistance of the ballast resistor 16 is set to 300 Ω and 1500 Ω in the semiconductor device 1 of the third comparative example, the output power, the power gain, and the current consumption in relation to the input power were examined by simulation. FIGS. 13 and 14 show the results.

In this simulation, the frequency of high frequency signals is 5 GHz, and the load impedance ZL is (9.73+j7.24) Ω. Moreover, the signal source impedance Zs is set to a value that is a conjugate of the input impedance of the HBT 3 including the ballast resistor 16 and the capacitor 17. Thus, the signal source impedance Zs is set to (1.13+j7.5) Ω when the ballast resistor 16 is 300 Ω, and the signal source impedance Zs is set to (1.25+j14.27) Ω when the ballast resistor 16 is 1500 Ω.

As is shown by the results in FIGS. 13 and 14, in the semiconductor device 1 of the third comparative example, when the resistance of the ballast resistor 16 is changed from 300 Ω to 1500 Ω, an increase in the current due to the input power is suppressed, and both the output power and the power gain decrease. As a result, it is found that, when the resistance of the ballast resistor 16 is set to 1500 Ω, although the stability against oscillation at low frequencies is improved, the output power and the power gain decrease, so that a desired output cannot be obtained.

Figure 3:
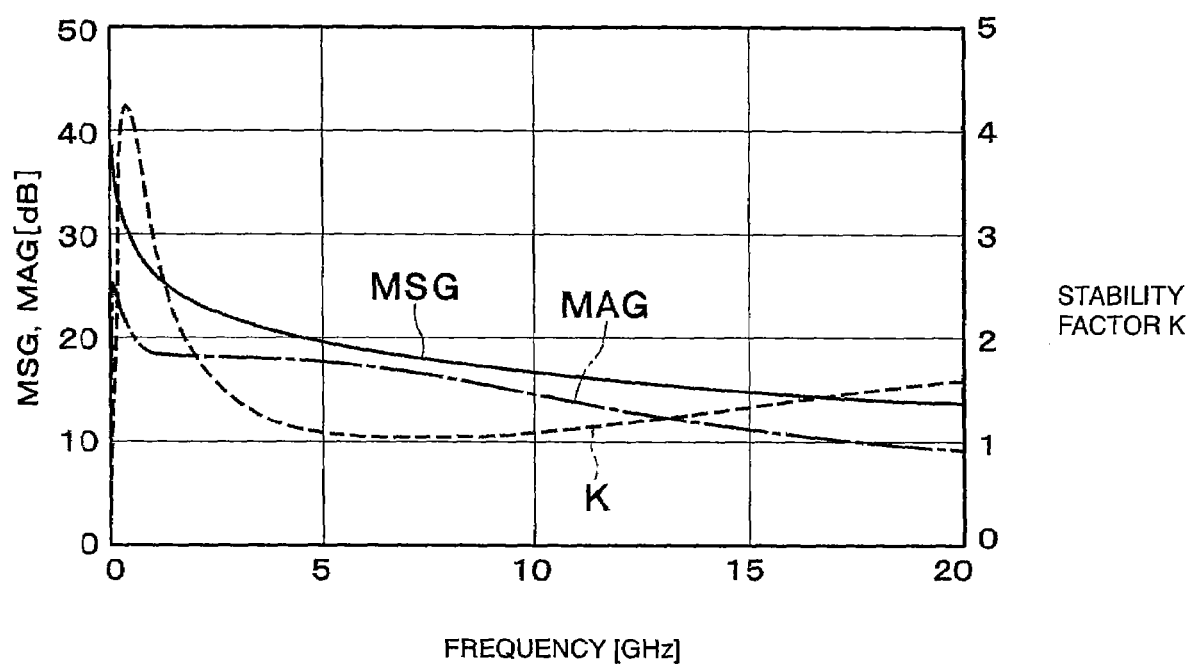
FIG. 3 is a characteristic diagram showing frequency characteristics of the stability factor, the maximum stable power gain, and the maximum available power gain of the semiconductor device shown in FIG. 2.

For comparison with the first to third comparative examples, regarding the semiconductor device 1 according to this embodiment, frequency characteristics of the stability factor K, the maximum stable power gain MSG, and the maximum available power gain MAG were examined by simulation. FIG. 3 shows the results.

In this simulation, the semiconductor device 1 includes ten pieces of the amplifier circuit 2. Moreover, the resistance of the ballast resistor 5 is, for example, 300 Ω, the resistance of the resistor 6 in the oscillation stabilizing circuit 4 is 1500 Ω, and the capacitance of the capacitor 7 is, for example, 0.25 pF. Moreover, a drive voltage (the collector voltage Vc) is 3 V, and the collector current Ic is 50.24 mA. Moreover, the signal source impedance Zs, the load impedance ZL, the capacitor C0, and the inductor L0 are connected to the signal source S side (the input side) and the load L side (the output side), as in the first comparative example.

As is shown by the results in FIG. 3, in the semiconductor device 1 according to this embodiment, the stability factor K exceeds one (K>1) even at frequencies of several hundreds of megahertz or less, so that the stability against oscillation is improved across the substantially entire frequency band. The reason for this is that, since the oscillation stabilizing circuit 4, in which the resistor 6 and the capacitor 7 are connected in parallel, is connected on the path for high frequency signals, low frequency signals pass through the resistor 6, so that a voltage drop occurs. In this case, the resistance of the resistor 6 is set to a value that is higher than the resistance of the ballast resistor 5 such that a sufficient voltage drop occurs even at low frequencies at which the maximum stable power gain MSG is high. Thus, oscillation can be suppressed even for low frequency signals of, for example, several hundreds of megahertz or less.

Figure 4:
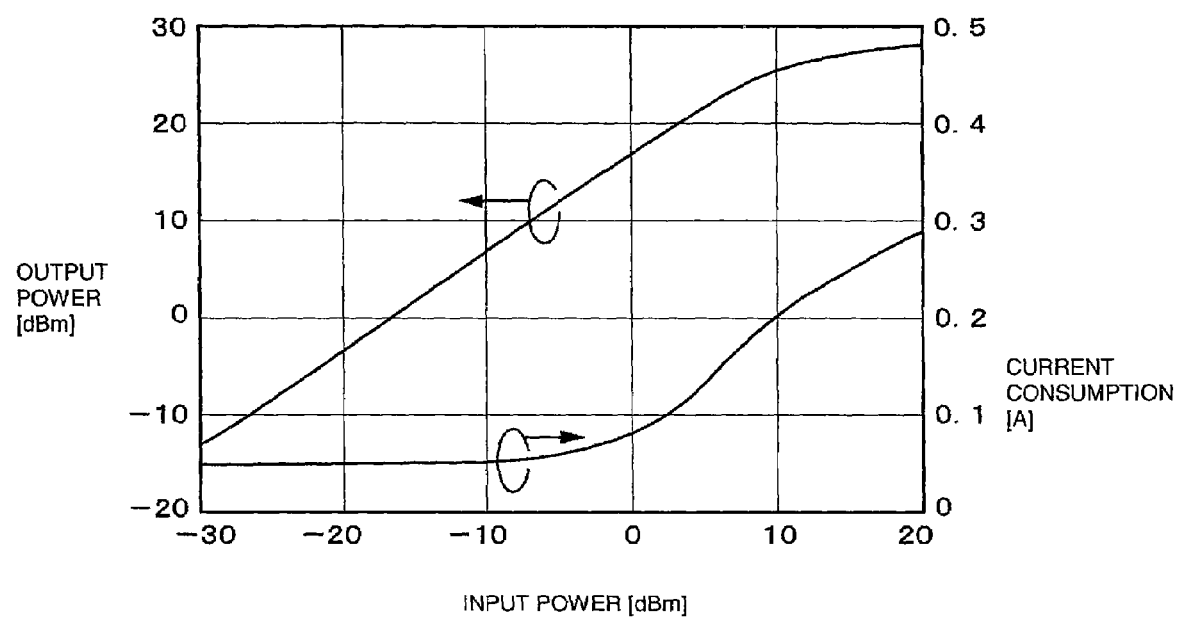
FIG. 4 is a characteristic diagram showing the output power and the current consumption in relation to the input power of the semiconductor device shown in FIG. 2.
Figure 5:
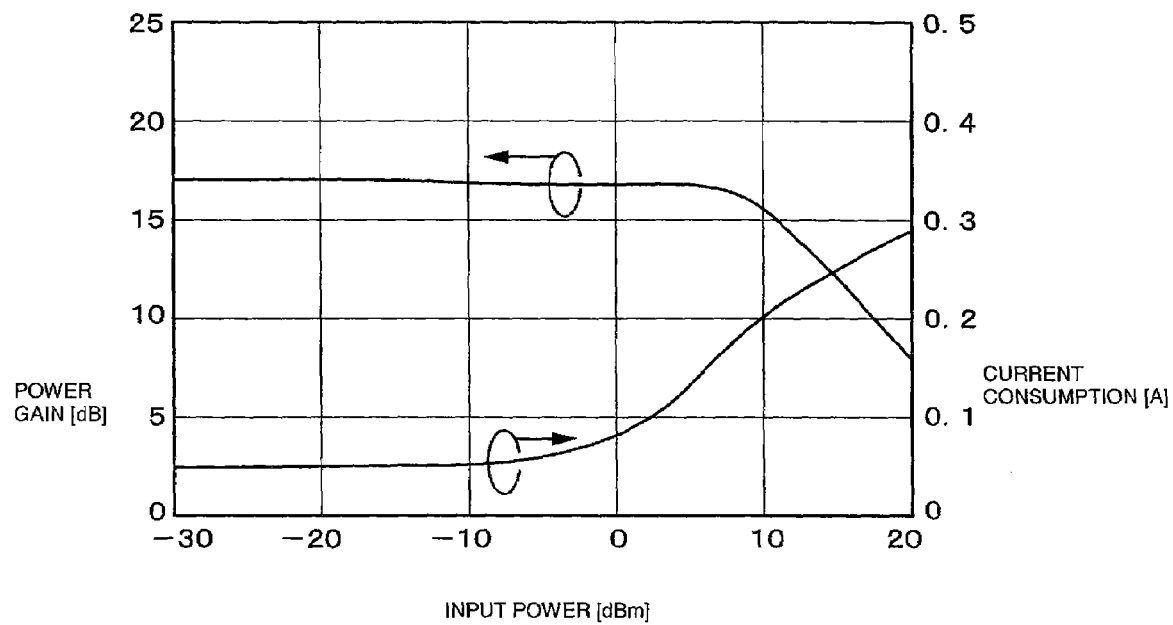
FIG. 5 is a characteristic diagram showing the power gain and the current consumption in relation to the input power of the semiconductor device shown in FIG. 2.

Moreover, regarding the semiconductor device 1 according to this embodiment, the output power, the power gain, and the current consumption in relation to the input power were examined by simulation. FIGS. 4 and 5 show the results.

In this simulation, the frequency of high frequency signals is 5 GHz, and the load impedance ZL is (9.73+j7.24) Ω. Moreover, the signal source impedance Zs is set to a value of (1.13+j14.55) Ω that is a conjugate of the input impedance of the HBT 3 including the ballast resistor 6 and the capacitor 7.

As is shown by the results in FIGS. 4 and 5, in the semiconductor device 1 according to this embodiment, substantially the same output power and power gain as in the case where the resistance of the ballast resistor 16 is set to 300 Ω in the third comparative example can be obtained.

Thus, in this embodiment, since the oscillation stabilizing circuit 4 is provided between the input terminal RFin and the base B of the HBT 3, the oscillation stabilizing circuit 4 is having a resistive component for low frequency signals input from the input terminal RFin and is short-circuited for high frequency signals. Thus, since the oscillation stabilizing circuit 4 functions as a resistor for signals having frequencies lower than the frequencies (for example, several gigahertz) in use, oscillation of low frequency signals can be suppressed, so that the stability can be improved. On the other hand, since the oscillation stabilizing circuit 4 is short-circuited for signals having frequencies higher than the frequencies in use, high frequency signals can be input to the base B of the HBT 3 without loss and amplified.

Moreover, the ballast resistor 5 is provided between the bias terminal Bin and the base B of the HBT 3. Thus, even when an overcurrent is caused to flow into the base B by heating of the HBT 3, a voltage drop corresponding to the overcurrent can be produced using the ballast resistor 5, so that thermorunaway of the HBT 3 can be suppressed.

Moreover, an arrangement is adopted, in which the oscillation stabilizing circuit 4 and the ballast resistor 5 are provided in parallel, so that the oscillation stabilizing circuit 4 and the ballast resistor 5 are independently connected to the base B of the HBT 3. In this arrangement, the oscillation stabilizing circuit 4 and the ballast resistor 5 do not affect each other, so that the oscillation stabilizing circuit 4 and the ballast resistor 5 can be designed separately. Thus, even when both the suppression of thermorunaway and the stability against oscillation are achieved, no excessive voltage drop by the ballast resistor 5 occurs, so that the minimum voltage drop necessary to prevent thermorunaway can be produced. As a result, unnecessary voltage drop can be prevented, so that a high output power can be obtained.

In particular, in this embodiment, since the oscillation stabilizing circuit 4 includes an RC parallel circuit in which the resistor 6 and the capacitor 7 are connected in parallel, the capacitor 7 is interrupted for low frequency signals and is short-circuited for high frequency signals. Thus, low frequency signals pass through the resistor 6, and high frequency signals pass through the capacitor 7. Accordingly, the oscillation stabilizing circuit 4 can be having a resistive component for low frequency signals and can be short-circuited for high frequency signals. As a result, the oscillation stabilizing circuit 4 is having a resistive component for signals having frequencies lower than the frequencies in use, so that oscillation of low frequency signals can be suppressed, thereby improving the stability. On the other hand, the oscillation stabilizing circuit 4 is short-circuited for signals having frequencies higher than the frequencies in use, so that high frequency signals can be input to the base B of the HBT 3 without loss. Moreover, in the oscillation stabilizing circuit 4, low frequency signals pass through the resistor 6, and high frequency signals pass through the capacitor 7. Thus, the stability against oscillation can be adjusted in response to the resistance of the resistor 6, and frequencies of signals for which the capacitor 7 is short-circuited can be adjusted in response to the capacitance of the capacitor 7.

Moreover, since the semiconductor device 1 is constructed with the HBT 3, high frequency signals can be amplified while high-speed processing, low power consumption, and the like are achieved. Thus, the semiconductor device 1 can be applied to, for example, wireless communication apparatuses.

Figure 15:
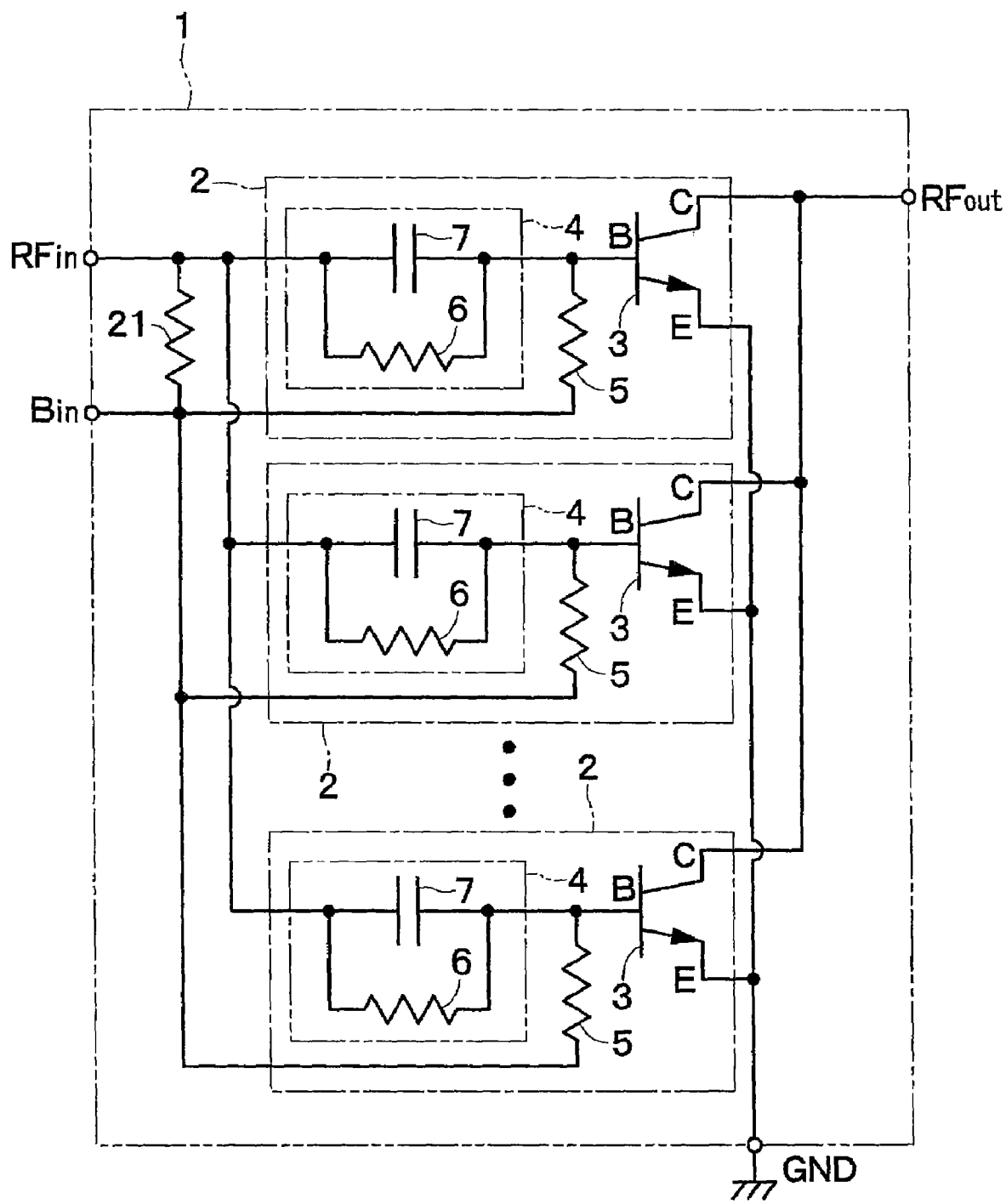
FIG. 15 is a circuit diagram showing a semiconductor device according to a second embodiment.

Next, FIG. 15 shows a power amplifier (a power amplifier module) in which a semiconductor device according to a second embodiment of the present invention is used. This embodiment is characterized in that a distortion reducing resistor is connected between an input terminal and a bias terminal. In this embodiment, the same reference numerals as in the aforementioned first embodiment are assigned to corresponding components, and the description thereof is omitted.

In the power amplifier shown in FIG. 15, a distortion reducing resistor 21 is connected between the input terminal RFin and the bias terminal Bin. The distortion reducing resistor 21 includes a resistance element, the impedance of which does not substantially depend on the frequency. The resistance of the distortion reducing resistor 21 is set to a value such that a part of the alternating current component of the base current is allowed to bypass the ballast resistor 5 and flow between the base B of the HBT 3 and the bias terminal Bin.

The distortion reducing resistor 21 is set to a relatively low value (for example, 50 Ω) compared with the ballast resistor 5 (for example, 300 Ω). In this case, the resistor 6 in the oscillation stabilizing circuit 4 is set to a value (for example, 100 Ω) that is several times (for example, twice or more) as high as the ballast resistor 5 and is sufficiently large in relation to the ballast resistor 5. Thus, the amount of the direct current component of the base current that flows through the distortion reducing resistor 21 is small, and bias conditions do not substantially change. Moreover, since a voltage drop in the resistor 6 in the oscillation stabilizing circuit 4 is large, thermorunaway due to the base current flowing through the distortion reducing resistor 21 does not occur.

The semiconductor device 1 according to this embodiment has the aforementioned structure, and the operation of amplifying the high frequency signal RF is the same as that in the first embodiment.

On the other hand, unlike the first embodiment, in the second embodiment, the distortion reducing resistor 21 is connected between the input terminal RFin and the bias terminal Bin. The effect of reduction in distortion of the high frequency signal RF by the distortion reducing resistor 21 will now be considered with reference to FIGS. 16 to 18.

Figure 17:
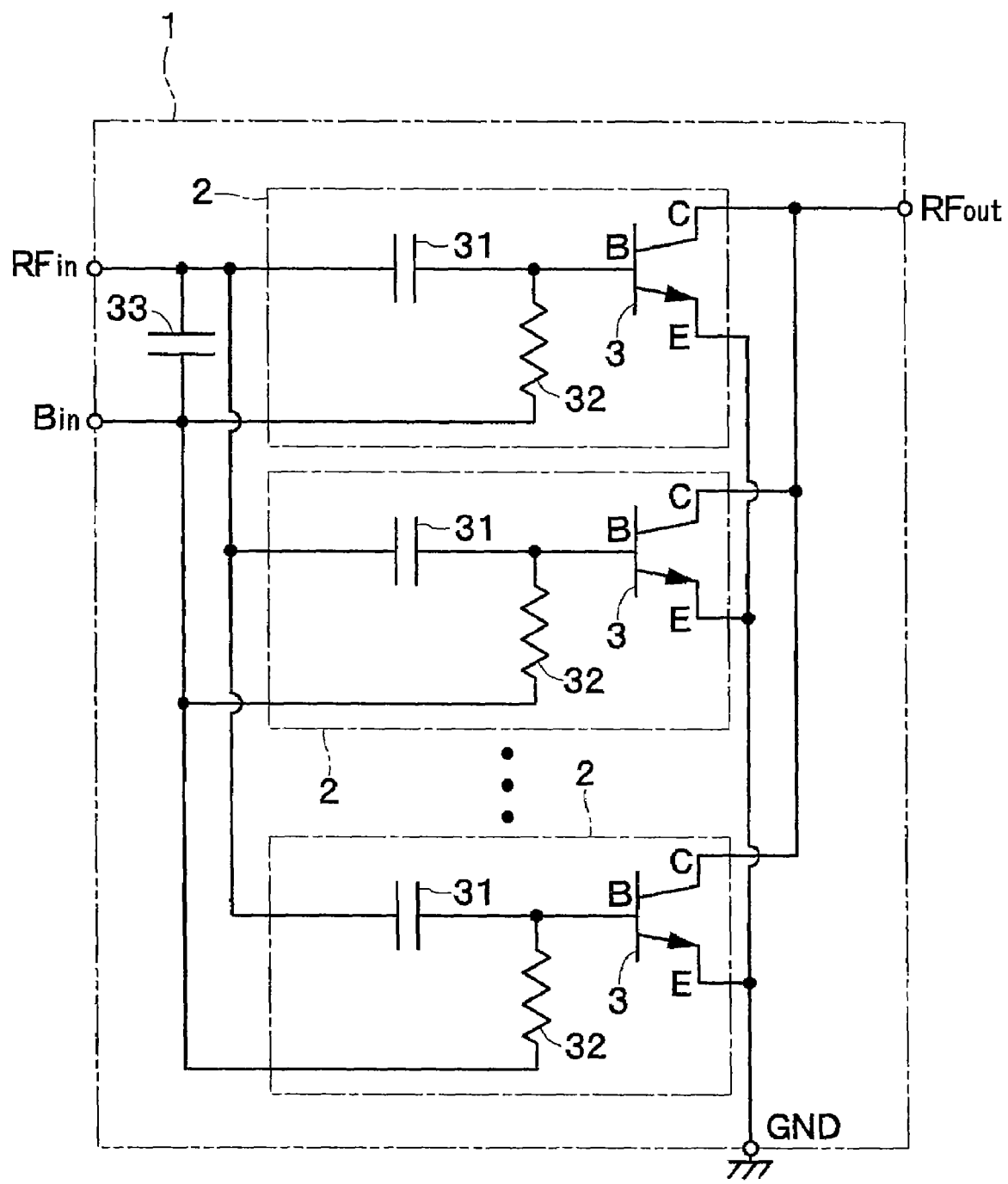
FIG. 17 is a circuit diagram showing a semiconductor device of a fourth comparative example.
Figure 18:
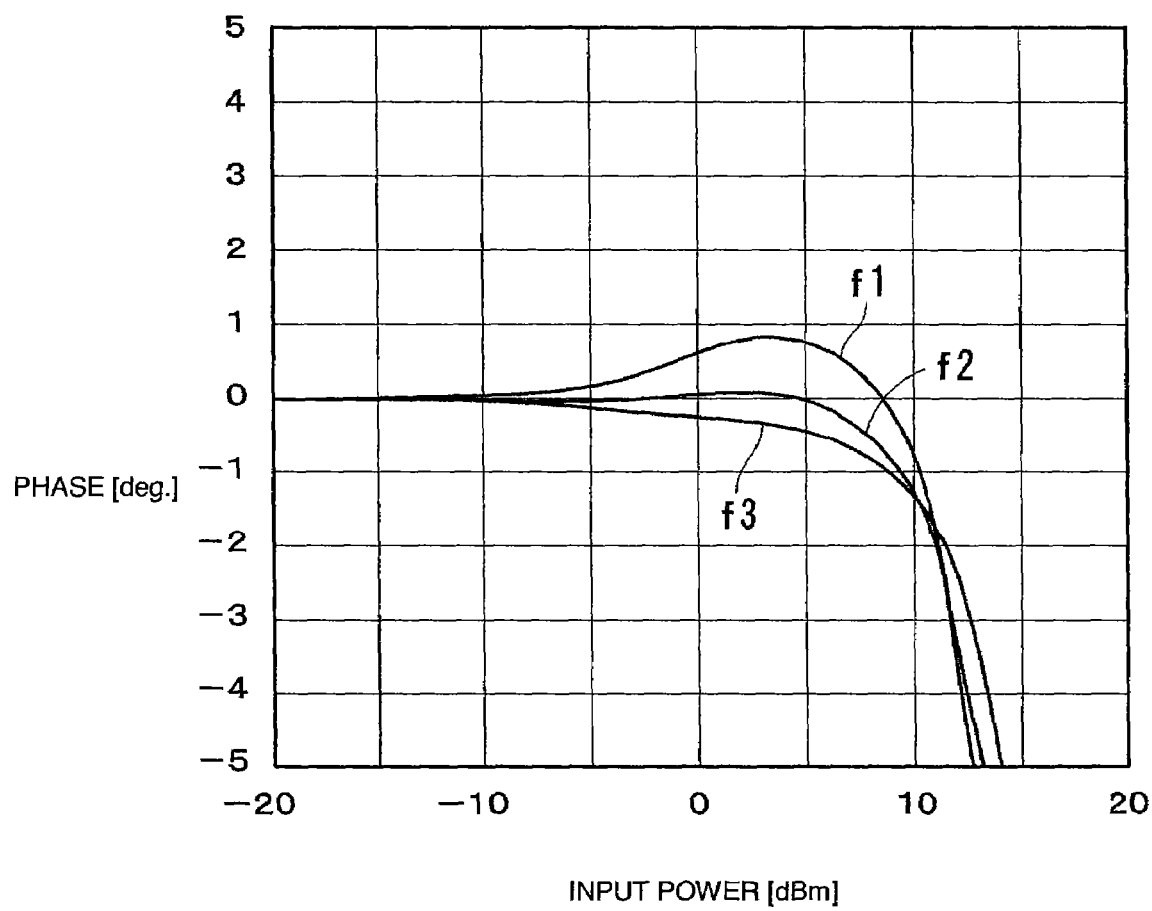
FIG. 18 is a characteristic diagram showing AM-PM characteristics of the semiconductor device shown in FIG. 17.

In a fourth comparative example shown in FIG. 17, a coupling capacitor 31 is connected between the base B of the HBT 3 in each of the amplifier circuits 2 and the input terminal RFin, and a ballast resistor 32 is connected between the base B and the bias terminal Bin. Moreover, a by-pass capacitor 33 for causing the alternating current component of the base current to bypass is connected between the input terminal RFin and the bias terminal Bin. In this case, regarding the semiconductor device 1 of the fourth comparative example, AM-PM characteristics that represent the relationship between the input power (Amplitude) of the high frequency signal RF and the phase of the output signal were examined by simulation. FIG. 18 shows the results.

In AM-PM characteristics shown in FIG. 18, the phase of an output signal (the high frequency signal RF on the output terminal RFout side) output when an input signal (the high frequency signal RF on the input terminal RFin side) at the minimum level (for example, −20 dBm) is input is the reference (phase 0 degrees). Then, AM-PM characteristics shown in FIG. 18 show how the phase of the output signal changes with respect to the reference phase when only the level (the input power) of the input signal is increased without changing the phase of the input signal.

In this simulation, the capacitance of the coupling capacitor 31 is, for example, 0.44 pF, the resistance of the ballast resistor 32 is, for example, 300 Ω, and the capacitance of the by-pass capacitor 33 is, for example, 0.17 pF. Moreover, the high frequency signal RF has a signal band of, for example, ±0.5 GHz with its center being 5.4 GHz.

As is shown by the results in FIG. 18, in the fourth comparative example, when an input signal of 5 dBm is input, the phase of an output signal of a center frequency f2 (f2=5.4 GHz) of the signal band is kept about 0 degrees by the by-pass capacitor 33.

However, in the fourth comparative example, for example, the phase of an output signal of a lower-limit frequency f1 (f1=4.9 GHz) of the signal band is about 0.8 degrees, and the phase of an output signal of an upper-limit frequency f3 (f3=5.9 GHz) of the signal band is about −0.4 degrees. That is to say, distortion occurs in both the output signal of the lower-limit frequency f1 and the output signal of the upper-limit frequency f3. The reason for this is that, the higher the frequency, the lower the impedance of the by-pass capacitor 33, and a bypass path that extends through the capacitor 33 depends on the frequency. Thus, in the fourth comparative example, a phase difference of about 1.2 degrees occurs between the lower-limit frequency f1 and the upper-limit frequency f3 of the signal band, so that a problem exists in that distortion cannot be reduced across the entire signal band.

In AM-PM characteristics shown in FIG. 18, when the input power is equal to about 10 dBm or more, the phase sharply changes. This is a range in which the HBT 3 is saturated, and the range is not used for applications in which satisfactory AM-PM characteristics are needed. This is also applicable to AM-PM characteristics described below in FIG. 16.

Figure 16:
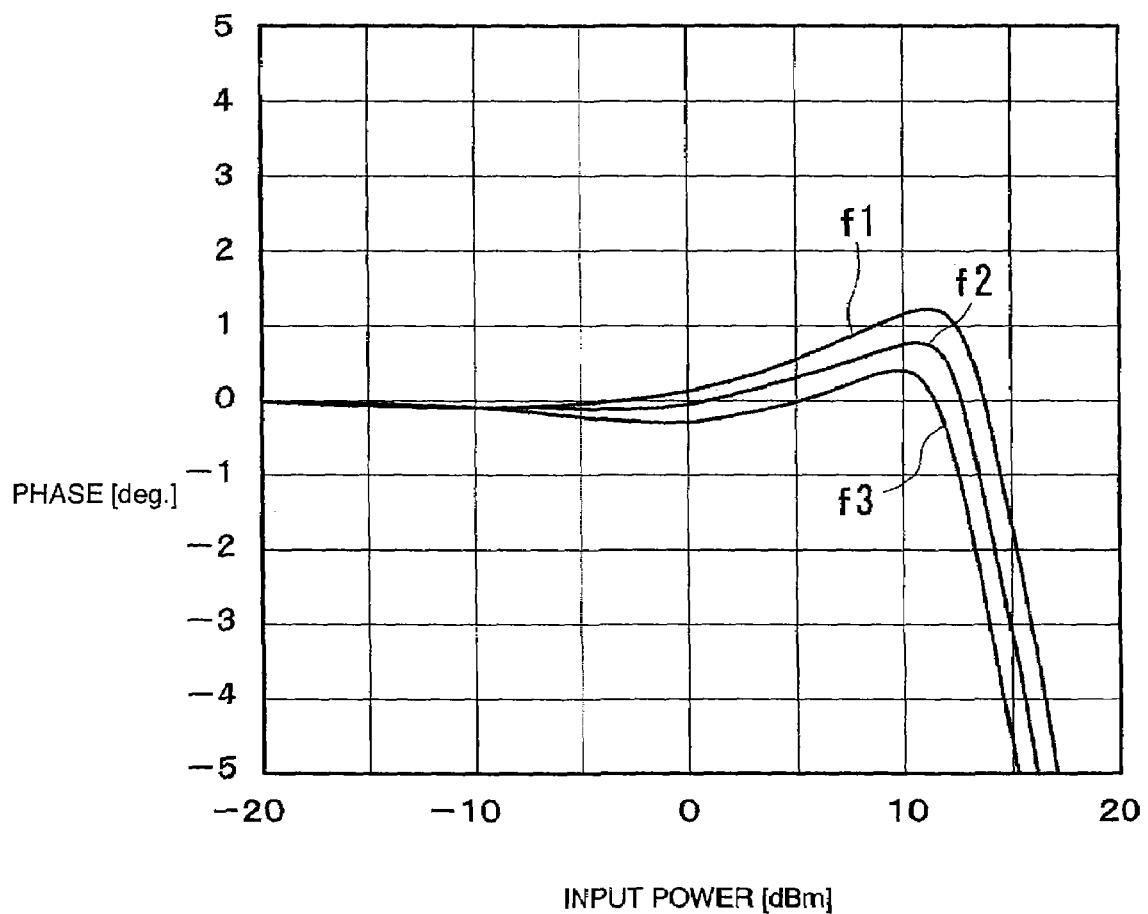
FIG. 16 is a characteristic diagram showing AM-PM characteristics of the semiconductor device shown in FIG. 15.

For comparison with the fourth comparative example, regarding the semiconductor device 1 according to the second embodiment, AM-PM characteristics were examined by simulation. FIG. 16 shows the results.

In AM-PM characteristics shown in FIG. 16, the phase of an output signal output when an input signal at the minimum level (for example, −20 dBm) is input is the reference (phase 0 degrees), as in AM-PM characteristics shown in FIG. 18. Moreover, in this simulation, the resistance of the ballast resistor 5 is, for example, 300 Ω, the resistance of the resistor 6 in the oscillation stabilizing circuit 4 is 1000 Ω, the capacitance of the capacitor 7 is, for example, 0.44 pF. Moreover, the resistance of the distortion reducing resistor 21 is, for example, 50 Ω.

As is shown by the results in FIG. 16, in the semiconductor device 1 according to the second embodiment, when an input signal of 5 dBm is input, the phase of an output signal of the center frequency f2 (f2=5.4 GHz) of the signal band is a small value of about 0.3 degrees. The reason for this is that the distortion reducing resistor 21 causes a part of the alternating current component of the base current to bypass the ballast resistor 5, as in the capacitor 33 in the fourth comparative example.

On the other hand, the phase of an output signal of the lower-limit frequency f1 (f1=4.9 GHz) is about 0.7 degrees, and the phase of an output signal of the upper-limit frequency f3 (f3=5.9 GHz) of the signal band is about 0 degrees. That is to say, the phase difference between the lower-limit frequency f1 and the upper-limit frequency f3 of the signal band is decreased to about 0.7 degrees, and is, for example, about half of that in the fourth comparative example. The reason for this is that, unlike the capacitor 33 in the fourth comparative example, the impedance of the distortion reduced resistor 21 does not substantially depend on the frequency, and thus the distortion reducing resistor 21 can cause a part of the alternating current component of the base current to bypass across a wide band, so that suppression of the collector current can be alleviated.

Thus, in this embodiment, operations and effects similar to those in the first embodiment can be obtained. In particular, in this embodiment, since the distortion reducing resistor 21 is connected between the input terminal RFin and the bias terminal Bin, distortion of the high frequency signal RF can be reduced across a wide band. Thus, the high frequency signal RF with little distortion can be amplified across the entire signal band.

Figure 19:
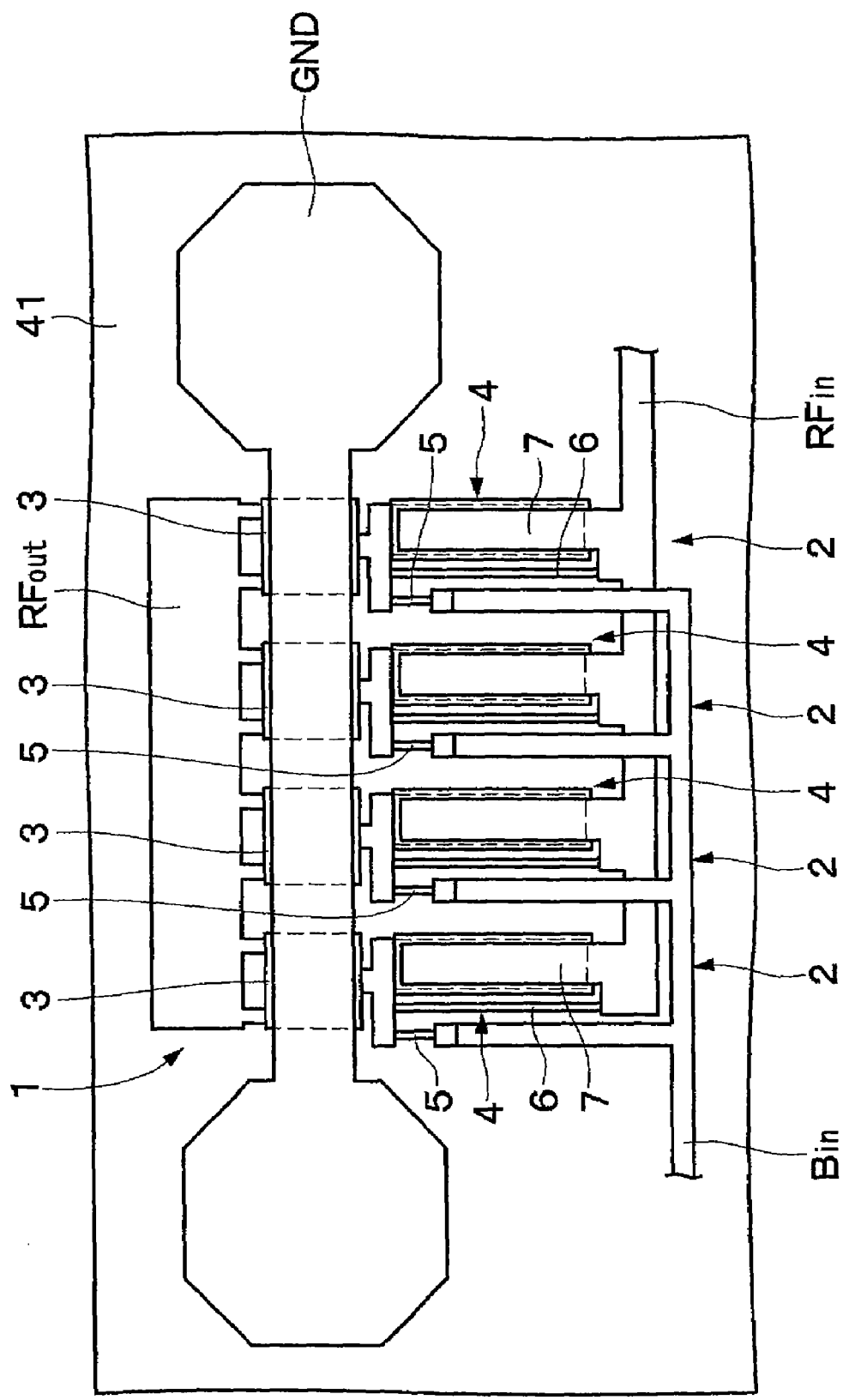
FIG. 19 is a plan view showing a power amplifier in which a semiconductor device according to a third embodiment is used.

Next, FIG. 19 shows a power amplifier (a power amplifier module) in which a semiconductor device according to a third embodiment of the present invention is used. This embodiment is characterized in that a plurality of amplifier circuits connected in parallel are monolithically formed on a semiconductor substrate. In this embodiment, the same reference numerals as in the aforementioned first embodiment are assigned to corresponding components, and the description is omitted.

A semiconductor substrate 41 that constitutes the semiconductor device 1 is composed of semiconductor material such as gallium arsenide (GaAs). For example, four pieces of the amplifier circuit 2, which includes the HBT 3, the oscillation stabilizing circuit 4, and the ballast resistor 5, are connected in parallel and formed on a surface of the semiconductor substrate 41.

In this case, the ballast resistor 5 and the resistor 6 in the oscillation stabilizing circuit 4 each include a resistor element of, for example, NiCr and are formed on the semiconductor substrate 41. Moreover, the capacitor 7 includes, for example, a metal-insulator-metal (MIM) capacitor in which an insulating film is sandwiched by metallic conductive films and is connected in parallel with the resistor 6. Moreover, the HBT 3 is formed on the semiconductor substrate 41, and the ballast resistor 5, the resistor 6, and the capacitor 7 are connected to the base B of the HBT 3. The oscillation stabilizing circuit 4 is connected to the input terminal RFin for high frequency signals via an electrode pattern provided on the surface of the semiconductor substrate 41. The ballast resistor 5 is insulated from the electrode pattern on the input terminal RFin side using an insulating film (not shown) and is connected to the bias terminal Bin via an electrode pattern provided on the surface of the semiconductor substrate 41. Moreover, the emitter E of the HBT 3 is connected to the ground terminal GND via a ground electrode provided so as to cover the HBT 3, and the collector C of the HBT 3 is connected to the output terminal RFout for high frequency signals via an electrode pattern. In this arrangement, the semiconductor device 1 is monolithically formed on the semiconductor substrate 41.

Thus, in this embodiment, operations and effects similar to those in the first embodiment can be obtained. In particular, in this embodiment, each of the amplifier circuits 2 is constructed with the HBT 3, the oscillation stabilizing circuit 4, and the ballast resistor 5, and the plurality of the amplifier circuits 2 connected in parallel are monolithically formed on the semiconductor substrate. Thus, in comparison with, for example, Patent Documents 2 and 3, only the ballast resistor 5 needs to be added, so that the area to be used on the semiconductor substrate 41 can be substantially the same as those in Patent Documents 2 and 3. Thus, a high power amplifier with a high stability against oscillation can be formed with substantially the same productivity as in the conventional art.

Moreover, since the plurality of the amplifier circuits 2 connected in parallel are monolithically formed on the semiconductor substrate 41, each of the amplifier circuits 2 can be constructed with the HBT 3, the ballast resistor 5, the resistor 6, and the capacitor 7 formed on the semiconductor substrate 41, so that an MMIC that amplifies high frequency signals can be formed.

Moreover, the power amplifier is constructed with the semiconductor device 1, which includes the oscillation stabilizing circuit 4 and the ballast resistor 5. Thus, while the stability against oscillation is achieved at all frequencies, thermorunaway can be prevented, and a high output power can be obtained.

In the third embodiment, the semiconductor device 1 according to the first embodiment is monolithically formed on the semiconductor substrate 41. However, the present invention is not limited to this embodiment, and, for example, the semiconductor device according to the second embodiment may be monolithically formed on a semiconductor substrate.

Moreover, in the aforementioned embodiments, a heterojunction bipolar transistor (the HBT 3) is used as a bipolar transistor. However, the present invention is not limited to these embodiments, and, for example, a bipolar transistor other than a heterojunction bipolar transistor may be used.

Moreover, in the aforementioned embodiments, cases are described where, for example, four or ten amplifier circuits 2 are connected in parallel. However, it is sufficient that a plurality (more than one unit) of the amplifier circuit 2 are connected in parallel.

Although the present invention has been described in relation to particular embodiments thereof, many other variations and modifications and other uses will become apparent to those skilled in the art. Therefore, the present invention is not limited by the specific disclosure herein.

What is claimed is:

1. A semiconductor device comprising a plurality of high frequency amplifier circuits connected in parallel between an input terminal and an output terminal,
   wherein each of the amplifier circuits includes a bipolar transistor, a collector of the bipolar transistor being connected to the output terminal,
   an oscillation stabilizing circuit connected between the input terminal and a base of the bipolar transistor, the oscillation stabilizing circuit having a resistive component for low frequency signals and a substantially short-circuited component for high frequency signals, and
   a ballast circuit for preventing thermorunaway of the bipolar transistor, one end of the ballast circuit being connected to a bias terminal, the other end being connected to a point between the oscillation stabilizing circuit and
the base of the bipolar transistor,
wherein a distortion reducing resistor for reducing distortion of high frequency signals at the output terminal is connected between the input terminal and the bias terminal.

2. The semiconductor device according to claim 1, wherein said resistive component and said substantially short-circuited component in said oscillation stabilizing circuit are connected in parallel.

3. The semiconductor device according to claim 2, wherein said substantially short-circuited component includes a capacitor.

4. The semiconductor device according to claim 1, wherein the oscillation stabilizing circuit includes an RC parallel circuit in which a resistor and a capacitor are connected in parallel.

5. The semiconductor device according to claim 1, wherein the ballast circuit includes a ballast resistor connected between the bias terminal and the base of the bipolar transistor.

6. The semiconductor device according to claim 1, wherein the bipolar transistor includes a heterojunction bipolar transistor.

7. The semiconductor device according to claim 1, wherein the plurality of amplifier circuits connected in parallel are monolithically formed on a semiconductor substrate.

8. A power amplifier comprising the semiconductor device according to any one of claims 1, 4, 5, 6, or 7, an input circuit, and an output circuit.

9. The semiconductor device according to claim 4, wherein the ballast circuit includes a ballast resistor connected between the bias terminal and the base of the bipolar transistor.

10. The semiconductor device according to claim 9, wherein the resistance of the oscillation stabilizing resistor is at least twice the resistance of the ballast resistor.

11. A semiconductor device comprising a plurality of high frequency amplifier circuits connected in parallel between an input terminal and an output terminal,
wherein each of the amplifier circuits includes a bipolar transistor, a collector of the bipolar transistor being connected to the output terminal,
an oscillation stabilizing circuit connected between the input terminal and a base of the bipolar transistor, the oscillation stabilizing circuit having a resistive component for low frequency signals and a substantially short-circuited component for high frequency signals, and
a ballast circuit for preventing thermorunaway of the bipolar transistor, one end of the ballast circuit being connected to a bias terminal, the other end being connected to a point between the oscillation stabilizing circuit and the base of the bipolar transistor,
wherein the oscillation stabilizing circuit includes an RC parallel circuit in which a resistor and a capacitor are connected in parallel,
wherein the ballast circuit includes a ballast resistor connected between the bias terminal and the base of the bipolar transistor, and
wherein a distortion reducing resistor for reducing distortion of high frequency signals at the output terminal is connected between the input terminal and the bias terminal.

12. The semiconductor device according to claim 11 wherein the resistance of the ballast resistor is greater than that of the distortion reducing resistor.

13. The semiconductor device according to claim 12 wherein the resistance of the oscillation stabilizing resistor is at least twice the resistance of the ballast resistor.

14. A semiconductor device comprising a plurality of high frequency amplifier circuits connected in parallel between an input terminal and an output terminal,
wherein each of the amplifier circuits includes a bipolar transistor, a collector of the bipolar transistor being connected to the output terminal,
an oscillation stabilizing circuit connected between the input terminal and a base of the bipolar transistor, the oscillation stabilizing circuit having a resistive component for low frequency signals and a substantially short-circuited component for high frequency signals, and
a ballast circuit for preventing thermorunaway of the bipolar transistor, one end of the ballast circuit being connected to a bias terminal, the other end being connected to a point between the oscillation stabilizing circuit and the base of the bipolar transistor;
wherein a distortion reducing resistor for reducing distortion of high frequency signals at the output terminal is connected between the input terminal and the bias terminal;
wherein the ballast circuit includes a ballast resistor connected between the bias terminal and the base of the bipolar transistor;
wherein the resistance of the oscillation stabilizing resistor is at least twice the resistance of the ballast resistor.

15. A semiconductor device comprising a plurality of high frequency amplifier circuits connected in parallel between an input terminal and an output terminal,
wherein each of the amplifier circuits includes a bipolar transistor, a collector of the bipolar transistor being connected to the output terminal,
an oscillation stabilizing circuit connected between the input terminal and a base of the bipolar transistor, the oscillation stabilizing circuit having a resistive component for low frequency signals and a substantially short-circuited component for high frequency signals, and
a ballast circuit for preventing thermorunaway of the bipolar transistor, one end of the ballast circuit being connected to a bias terminal, the other end being connected to a point between the oscillation stabilizing circuit and the base of the bipolar transistor;
wherein a distortion reducing resistor for reducing distortion of high frequency signals at the output terminal is connected between the input terminal and the bias terminal;
wherein the ballast circuit includes a ballast resistor connected between the bias terminal and the base of the bipolar transistor;
wherein the resistance of the ballast resistor is greater than that of the distortion reducing resistor.

16. The semiconductor device according to claim 15, wherein the resistance of the oscillation stabilizing resistor is at least twice the resistance of the ballast resistor.

* * * * *